（12）United States Patent
Mun et al.

(10) Patent No.: US 12,538,848 B2
(45) Date of Patent: Jan. 27, 2026

(54) SEMICONDUCTOR PACKAGE

(71) Applicant: Samsung Electronics Co., Ltd., Suwon-si (KR)

(72) Inventors: Kyungdon Mun, Suwon-si (KR); Juhyeon Kim, Suwon-si (KR); Sangcheon Park, Suwon-si (KR); Taeyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 18/210,958

(22) Filed: Jun. 16, 2023

(65) Prior Publication Data
US 2024/0063193 A1 Feb. 22, 2024

(30) Foreign Application Priority Data

Aug. 17, 2022 (KR) .................. 10-2022-0102951

(51) Int. Cl.
H01L 25/10 (2006.01)
H01L 23/00 (2006.01)
H01L 23/498 (2006.01)

(52) U.S. Cl.
CPC ...... *H01L 25/105* (2013.01); *H01L 23/49827* (2013.01); *H01L 24/08* (2013.01); *H01L 24/16* (2013.01); *H01L 24/32* (2013.01); *H01L 24/73* (2013.01); *H01L 24/80* (2013.01); *H01L 2224/08145* (2013.01); *H01L 2224/16227* (2013.01); *H01L 2224/32225* (2013.01); *H01L 2224/73204* (2013.01);

(Continued)

(58) Field of Classification Search
CPC ......... H01L 23/49817; H01L 23/49827; H01L 23/481; H01L 24/08; H01L 24/16; H01L 24/32; H01L 24/73; H01L 24/80; H01L 2224/08145; H01L 2224/16227; H01L 2224/32225; H01L 2224/73204; H01L 2224/8082; H01L 25/0657
See application file for complete search history.

(56) References Cited

U.S. PATENT DOCUMENTS 9,941,243 B2  4/2018 Kim et al.
10,141,391 B2 11/2018 Yang
(Continued)

FOREIGN PATENT DOCUMENTS

CN    104517921 A    4/2015

*Primary Examiner* — Khiem D Nguyen
(74) *Attorney, Agent, or Firm* — Sughrue Mion, PLLC

(57) ABSTRACT

A semiconductor package includes a first semiconductor chip including a first semiconductor substrate having a first active surface and a first inactive surface opposite to each other, a plurality of through electrodes penetrating the first semiconductor substrate, and a rear cover layer covering the first inactive surface, a second semiconductor chip stacked on the first semiconductor chip and including a second semiconductor substrate having a second active surface and a second inactive surface opposite to each other, and a front cover layer covering the second active surface, a plurality of signal pad structures penetrating the rear cover layer and the front cover layer to be electrically connected to the plurality of through electrodes, and a plurality of dummy pad structures apart from the plurality of signal pad structures in a horizontal direction, and penetrating the rear cover layer and the front cover layer.

20 Claims, 30 Drawing Sheets

(52) U.S. Cl.
CPC ............... *H01L 2224/8082* (2013.01); *H01L 2924/1432* (2013.01); *H01L 2924/1436* (2013.01)

(56) References Cited

U.S. PATENT DOCUMENTS

| | | |
|---|---|---|
| 10,157,889 B2 | 12/2018 | Chen et al. |
| 10,840,190 B1 * | 11/2020 | Yang ................. H01L 25/50 |
| 10,998,293 B2 | 5/2021 | Chen et al. |
| 11,233,088 B2 | 1/2022 | Chen et al. |
| 11,309,243 B2 | 4/2022 | Chen et al. |
| 2015/0214207 A1 * | 7/2015 | Yoshida ............... H01L 21/563 |
| | | 438/109 |
| 2021/0043673 A1 | 2/2021 | Kwon et al. |
| 2022/0293580 A1 | 9/2022 | Park et al. |

\* cited by examiner

SEMICONDUCTOR PACKAGE

CROSS-REFERENCE TO RELATED APPLICATION

This application is based on and claims priority under 35 U. S. C. § 119 to Korean Patent Application No. 10-2022-0102951, filed on Aug. 17, 2022, in the Korean Intellectual Property Office, the disclosure of which is incorporated by reference herein in its entirety.

BACKGROUND

The disclosure relates to a semiconductor package, and more particularly, to a semiconductor package having stacked semiconductor chips.

As the miniaturization, multi-functionality, and high performance of electronic products are required, high integration and high speed of semiconductor packages are required as well. To this end, a semiconductor package having a plurality of semiconductor chips including stacked semiconductor chips has been developed.

SUMMARY

Example embodiments provide a semiconductor package having stacked semiconductor chips, in which operation reliability and heat dissipation performance are improved.

According to an aspect of an example embodiment, a semiconductor package includes: a first semiconductor chip including a first semiconductor substrate having a first active surface and a first inactive surface opposite to the first active surface, a plurality of through electrodes penetrating at least a portion of the first semiconductor substrate, and a rear cover layer including a first rear cover layer provided on the first inactive surface and an second rear cover layer provided on the first rear cover layer; a second semiconductor chip provided on the first semiconductor chip, the second semiconductor chip including a second semiconductor substrate having a second active surface and a second inactive surface that is opposite to the second active surface, and a front cover layer including a first front cover layer provided on the second active surface, and an second front cover layer provided on the first front cover layer, wherein the second front cover layer faces the second rear cover layer; a plurality of signal pad structures penetrating the rear cover layer and the front cover layer and electrically connected to the plurality of through electrodes, wherein a portion of each of the plurality of signal pad structures penetrating the second rear cover layer and the second front cover layer has a first horizontal width; and a plurality of dummy pad structures spaced apart from the plurality of signal pad structures in a horizontal direction, and penetrating the rear cover layer and the front cover layer, wherein a portion of each of the plurality of dummy pad structures penetrating the second rear cover layer and the second front cover layer has the first horizontal width, and a portion of at least one of the plurality of dummy pad structures penetrating the first rear cover layer and the first front cover layer has a horizontal width that is different from the first horizontal width.

According to an aspect of an example embodiment, a semiconductor package includes: a first semiconductor chip including a first semiconductor substrate having a first active surface and a first inactive surface that is opposite to the first active surface, a first semiconductor device on the first active surface, a plurality of front pads on the first active surface, a plurality of first through electrodes penetrating at least a portion of the first semiconductor substrate and electrically connected to the plurality of front pads, a first rear cover layer provided on the first inactive surface, and a rear dummy conductive layer including a rear wide dummy pattern and a rear narrow dummy pattern, each of the rear wide dummy pattern and the rear narrow dummy pattern penetrating the first rear cover layer; a second semiconductor chip including a second semiconductor substrate having a second active surface and a second inactive surface opposite to the second active surface, a second semiconductor device on the second active surface, a first front cover layer provided on the second active surface, and a front dummy conductive layer including a front wide dummy pattern and a front narrow dummy pattern, each of the front wide dummy pattern and the front narrow dummy pattern penetrating the first front cover layer, wherein the second semiconductor chip is bonded on the first semiconductor chip such that the first active surface faces the second inactive surface; a bonding cover layer between the first semiconductor chip and the second semiconductor chip; a plurality of bonded pads penetrating the first rear cover layer, the bonding cover layer, and the first front cover layer, the plurality of bonded pads being electrically connected to the plurality of first through electrodes, each of the plurality of bonded pads having a first horizontal width; and a plurality of dummy bonded pads penetrating the bonding cover layer, each of the plurality of dummy bonded pads being provided between the rear wide dummy pattern and the front wide dummy pattern or provided between the rear narrow dummy pattern and the front narrow dummy pattern, each of the plurality of dummy bonded pads having the first horizontal width, wherein a horizontal width of at least one of the rear wide dummy pattern, the rear narrow dummy pattern, the front wide dummy pattern, and the front narrow dummy pattern is different from the first horizontal width.

According to an aspect of an example embodiment, a semiconductor package includes: a first semiconductor chip; at least two second semiconductor chips stacked on the first semiconductor chip; a first bonding cover layer between the first semiconductor chip and a second semiconductor chip at a bottom of the at least two second semiconductor chips; a second bonding cover layer between the at least two second semiconductor chips; a plurality of first bonded pads and a plurality of first dummy bonded pads between the second semiconductor chip at the bottom of the at least two second semiconductor chips and the first semiconductor chip; and a plurality of second bonded pads and a plurality of second dummy bonded pads between the at least two second semiconductor chips, wherein the first semiconductor chip includes: a first semiconductor substrate having a first active surface and a first inactive surface opposite to the first active surface, a plurality of front pads on the first active surface, a plurality of first through electrodes penetrating at least a portion of the first semiconductor substrate and electrically connecting the plurality of front pads with the plurality of first bonded pads, a first rear cover layer provided on the first inactive surface of the first semiconductor substrate, a first rear wide dummy pattern and a first rear narrow dummy pattern, each of the first rear wide dummy pattern and the first rear narrow dummy pattern being provided in the first rear cover layer, wherein each of the at least two second semiconductor chips includes: a second semiconductor substrate having a second active surface and a second inactive surface opposite to the second active surface, a first front cover layer provided on the second active surface, a front wide dummy pattern and a front narrow dummy pattern, each of the front wide dummy pattern and the front narrow dummy pattern being provided in the first front cover layer, a plurality of second through electrodes penetrating at least a portion of the second semiconductor substrate and electrically connecting the plurality of first bonded pads with the plurality of second bonded pads, a second rear cover layer provided on the second inactive surface, and a second rear wide dummy pattern and a second rear narrow dummy pattern, each of the second rear wide dummy pattern and the second rear narrow dummy pattern being provided in the second rear cover layer, wherein the plurality of first bonded pads penetrate the first rear cover layer, the first bonding cover layer, and the first front cover layer of the second semiconductor chip at the bottom, wherein the plurality of second bonded pads penetrate the first front cover layer of one of the at least two second semiconductor chips, the second rear cover layer of another one of the at least two second semiconductor chips, and the second bonding cover layer, wherein the first front cover layer of the one of the at least two second semiconductor chips faces the second rear cover layer of the another one of the at least two second semiconductor chips, wherein the plurality of first dummy bonded pads penetrate the first bonding cover layer, wherein the plurality of second dummy bonded pads penetrate the second bonding cover layer, wherein the plurality of first bonded pads and the plurality of first dummy bonded pads have a same first horizontal width and are arranged at a same pitch, and wherein the plurality of second bonded pads and the plurality of second dummy bonded pads have the same first horizontal width and are arranged at the same pitch.

BRIEF DESCRIPTION OF THE DRAWINGS

The above and/or other aspects of the disclosure will be more clearly understood from the following detailed description taken in conjunction with the accompanying drawings in which.

DETAILED DESCRIPTION

Figure 1:
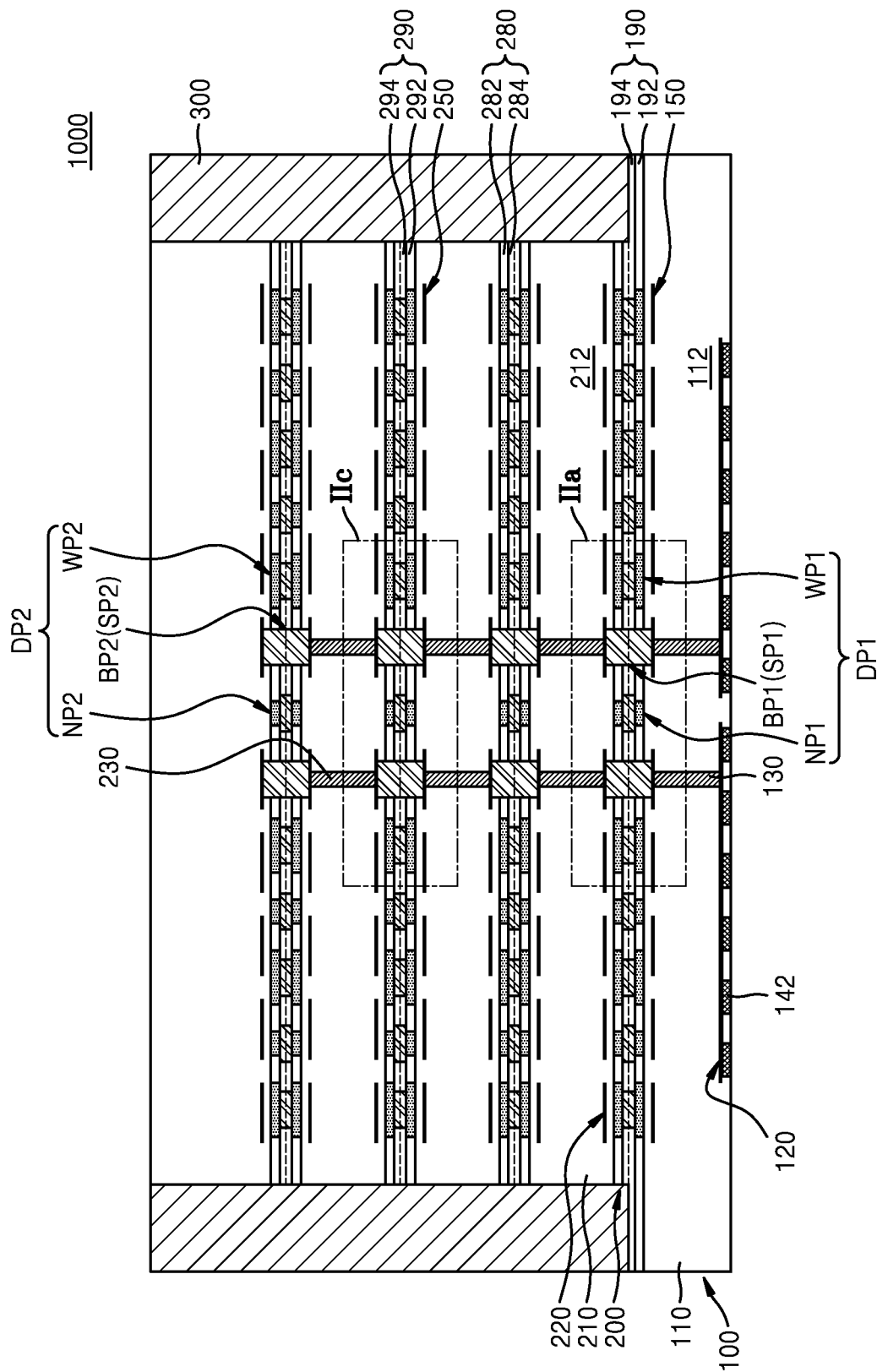
FIG. 1 is a cross-sectional view of a semiconductor package according to an embodiment.

Hereinafter, embodiments of the disclosure will be described more fully with reference to the accompanying drawings. Throughout the drawings, like reference numeral denote like constituent elements, and a redundant description thereof is omitted.

Figure 2A:
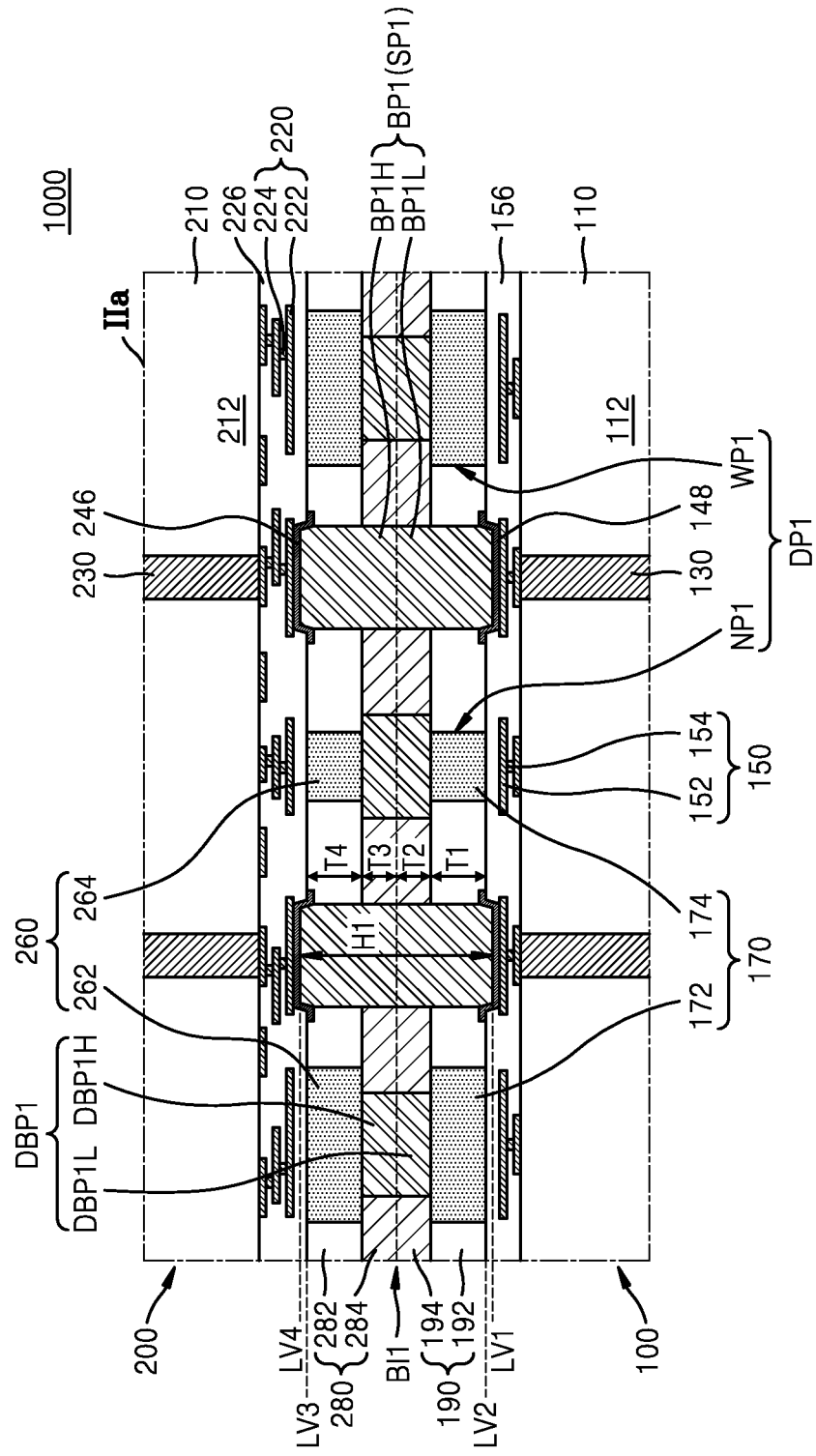
FIGS. 2A to 2D are enlarged cross-sectional views thereof.
Figure 2B:
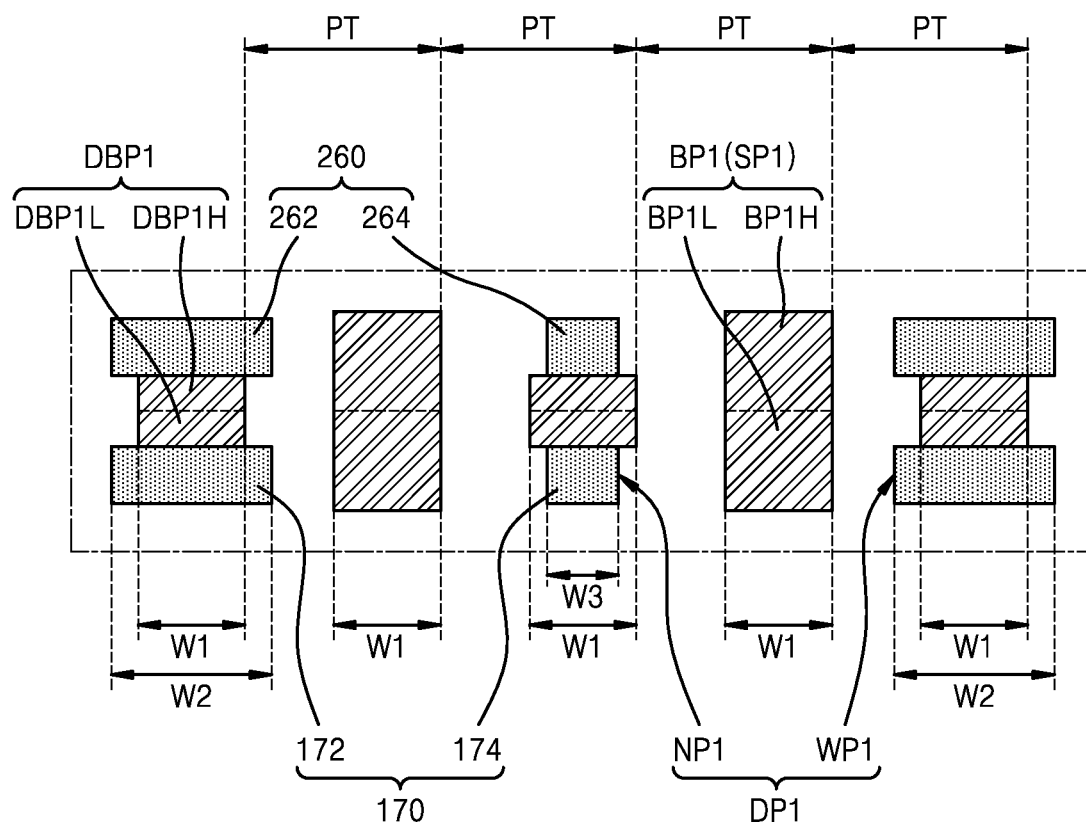
Figure 2C:
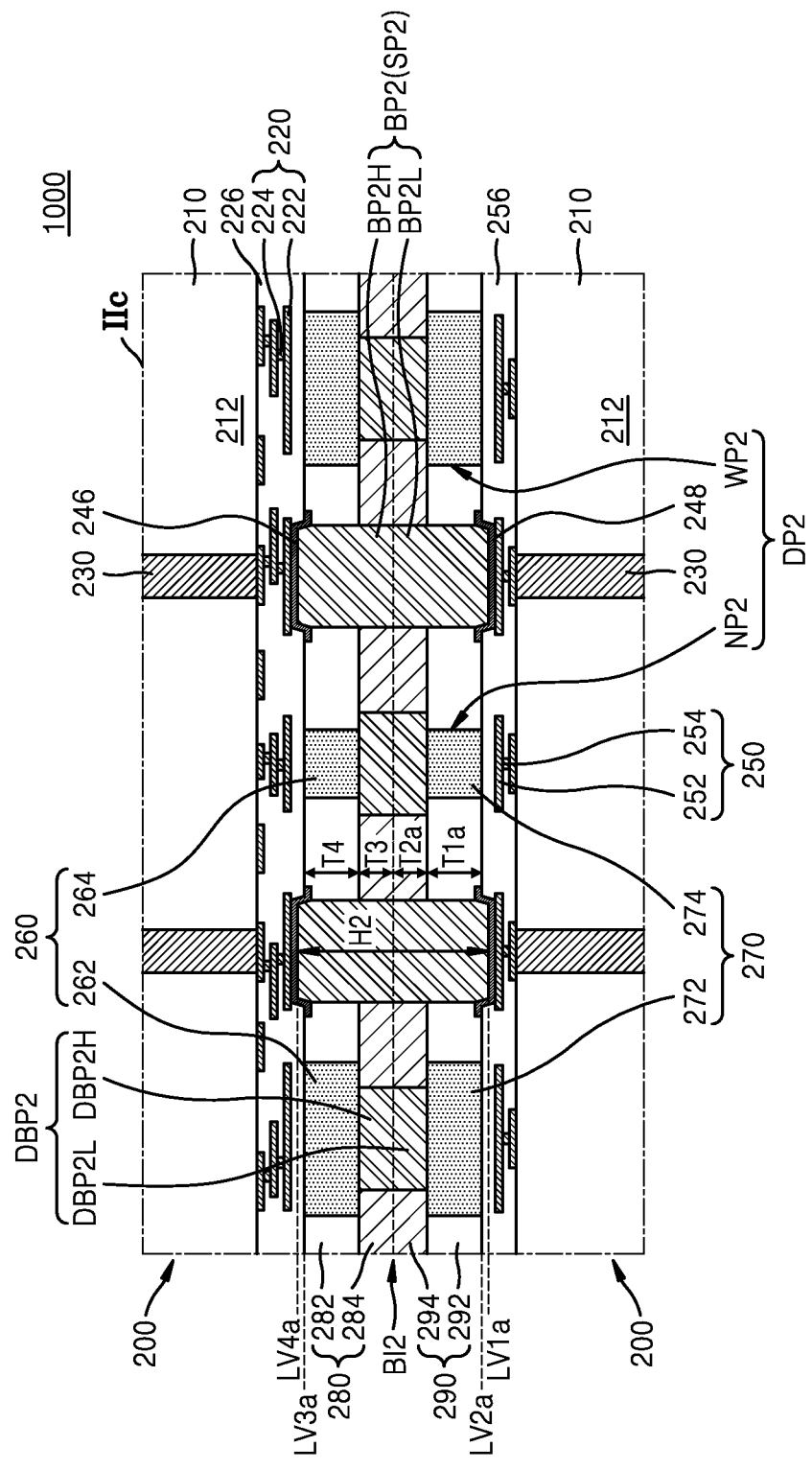
Figure 2D:
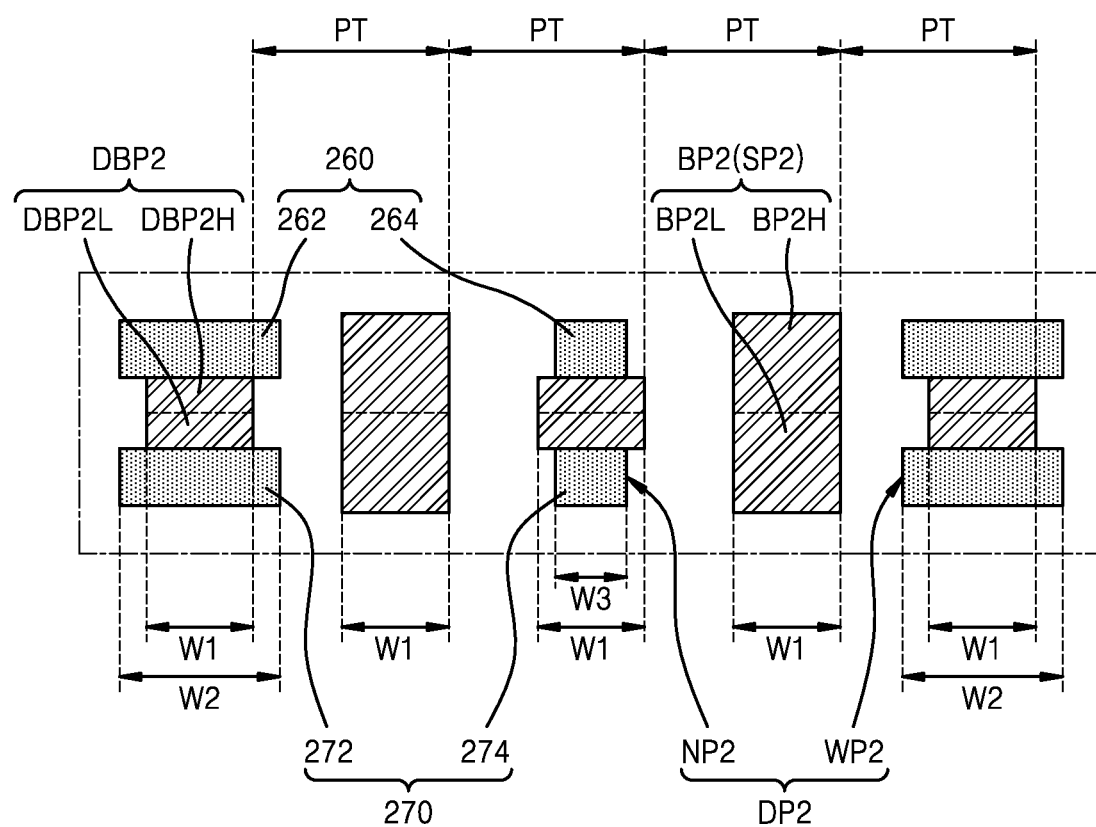

FIG. 1 is a cross-sectional view of a semiconductor package 1000 according to an embodiment, and FIGS. 2A to 2D are enlarged cross-sectional views thereof. In detail, FIG. 2A is an enlarged cross-sectional view of a region IIa of FIG. 1, FIG. 2B is an enlarged cross-sectional view illustrating some components of FIG. 2A, FIG. 2C is an enlarged cross-sectional view of a region IIc of FIG. 1, and FIG. 2D is an enlarged cross-sectional view illustrating some components of FIG. 2C.

Referring to FIGS. 1 to 2D, the semiconductor package 1000 may include a first semiconductor chip 100 and a plurality of second semiconductor chips 200. Although FIGS. 1 to 2D illustrate that the semiconductor package 1000 includes four second semiconductor chips 200, embodiments of the disclosure are not limited thereto. For example, the semiconductor package 1000 may include two or more second semiconductor chips 200. In some embodiments, the semiconductor package 1000 may the number of the second semiconductor chips 200 included in the semiconductor package 1000 may be a multiple of 4. The second semiconductor chips 200 may be stacked on the first semiconductor chip 100. The semiconductor package 1000 may be referred to as a sub-semiconductor package.

The first semiconductor chip 100 of the semiconductor package 1000 may be electrically connected to the second semiconductor chip 200 that is closest to the first semiconductor chip 100, for example, the second semiconductor chip 200 at the bottom of the second semiconductor chips 200, via a plurality of first bonded pads BP1, to exchange signals, and may provide power and ground. Among the second semiconductor chips 200 of the semiconductor package 1000, the two second semiconductor chips 200 adjacent to each other in a vertical direction may be electrically connected to each other via a plurality of second bonded pads BP2, to exchange signals, and may provide or receive power and ground. The first bonded pads BP1 may form a first signal pad structure SP1, and the second bonded pads BP2 may form a second signal pad structure SP2.

The first semiconductor chip 100 may include a first semiconductor substrate 110 having an active surface and an inactive surface that are opposite to each other, a first semiconductor device 112 formed on the active surface of the first semiconductor substrate 110, a first front wiring structure 120 formed on the active surface of the first semiconductor substrate 110, a plurality of first through electrodes 130 connected to the first front wiring structure 120 and penetrating at least a portion of the first semiconductor chip 100, and a first rear wiring structure 150 formed on the inactive surface of the first semiconductor substrate 110 and connected to the first through electrodes 130. The first semiconductor chip 100 may further include a plurality of first front pads 142 connected to the first front wiring structure 120. The active surface and the inactive surface of the first semiconductor substrate 110 may be referred to as a first active surface and a first inactive surface, respectively.

In the semiconductor package 1000, the first semiconductor chip 100 may be arranged such that the active surface of the first semiconductor substrate 110 faces downward, and the inactive surface thereof faces upward. Accordingly, unless mentioned otherwise in the specification, an upper surface of the first semiconductor chip 100 of the semiconductor package 1000 refers to a side that the inactive surface of the first semiconductor substrate 110 faces, and a lower surface of the first semiconductor chip 100 refers to a side that the active surface thereof faces. When described based on the first semiconductor chip 100, the lower surface of the first semiconductor chip 100 that the active surface of the first semiconductor substrate 110 faces may be referred to as the front surface of the first semiconductor chip 100, and the upper surface of the first semiconductor chip 100 that the inactive surface of the first semiconductor substrate 110 faces may be referred to as the rear surface of the first semiconductor chip 100.

The second semiconductor chips 200 may each include a second semiconductor substrate 210 having an active surface and an inactive surface that are opposite to each other, a second semiconductor device 212 formed on the active surface of the second semiconductor substrate 210, and a second front wiring structure 220 formed on the active surface of the second semiconductor substrate 210. The active surface and the inactive surface of the second semiconductor substrate 210 may be referred to as a second active surface and a second inactive surface, respectively.

The second semiconductor chips 200 may each further include a plurality of second through electrodes 230 connected to the second front wiring structure 220 and penetrating at least a portion of each of the second semiconductor chips 200, and a second rear wiring structure 250 formed on the inactive surface of the second semiconductor substrate 210 and connected to the second through electrodes 230. In some embodiments, among the second semiconductor chips 200, the second semiconductor chips 200 arranged farthest from the first semiconductor chip 100 and located at the top of the semiconductor package 1000 may not include the second through electrodes 230 and the second rear wiring structure 250. In some embodiments, among the second semiconductor chips 200, the thickness of the second semiconductor chips 200 arranged farthest from the first semiconductor chip 100 and located at the top of the semiconductor package 1000 may have a value greater than the thicknesses of the other second semiconductor chips 200.

In the semiconductor package 1000, the second semiconductor chips 200 may be sequentially stacked in a vertical direction on the first semiconductor chip 100 while the active surface thereof faces downward, that is, toward the first semiconductor chip 100. Accordingly, unless mentioned otherwise in the specification, the upper surface of the second semiconductor chips 200 of the semiconductor package 1000 refers to a side that the inactive surface of the second semiconductor substrate 210 faces, and the lower surface of the second semiconductor chips 200 refers to a side that the active surface of the second semiconductor substrate 210 faces. When described based on the second semiconductor chips 200, the lower surface of the second semiconductor chips 200 that the active surface of the second semiconductor substrate 210 faces may be referred to as the front surface of the second semiconductor chip 200, and the upper surface of the second semiconductor chips 200 that the inactive surface of the second semiconductor substrate 210 faces may be referred to as the rear surface of the second semiconductor chip 200.

The first semiconductor substrate 110 and the second semiconductor substrate 210 may each include a semiconductor material, for example, silicon (Si). Alternatively, the first semiconductor substrate 110 and the second semiconductor substrate 210 may each include a semiconductor material, for example, germanium (Ge). The first semiconductor substrate 110 and the second semiconductor substrate 210 may each have an active surface and an inactive surface opposite to the active surface. The first semiconductor substrate 110 and the second semiconductor substrate 210 may each include a conductive area, for example, a well doped with impurities. The first semiconductor substrate 110 and the second semiconductor substrate 210 may each have various device separation structures, such as a shallow trench isolation (STI) structure.

The first semiconductor device 112 and the second semiconductor device 212 may each include various types of a plurality of individual devices. The individual devices may include various microelectronic devices, for example, a metal-oxide-semiconductor field effect transistor (MOSFET), such as a complementary metal-oxide-semiconductor (CMOS) transistor and the like, an image sensor, such as a system large scale integration (LSI), a CMOS imaging sensor (CIS), and the like, a micro-electro-mechanical system (MEMS), an active device, a passive device, and the like. The individual devices may be electrically connected to the conductive area of the first semiconductor substrate 110 or the second semiconductor substrate 210. The first semiconductor device 112 and the second semiconductor device 212 may each further include a conductive wiring or a conductive plug that electrically connects at least two of the individual devices, or the individual devices with the conductive area of each of the first semiconductor substrate 110 and the second semiconductor substrate 210. Furthermore, the individual devices may be electrically separated from other neighboring individual devices by an insulating film.

In some embodiments, at least one of the first semiconductor chip 100 and the second semiconductor chips 200 may be a memory semiconductor chip. In some embodiments, at least one of the first semiconductor chip 100 and the second semiconductor chips 200 may be a central processing unit (CPU) chip, a graphics processing unit (GPU) chip, or an application processor (AP) chip.

In some embodiments, the semiconductor package 1000 including the first semiconductor chip 100 and the second semiconductor chips 200 may be referred to as a high bandwidth memory (HBM) DRAM semiconductor chip. For example, the first semiconductor chip 100 may include a serial-parallel conversion circuit and may be a buffer chip for controlling the second semiconductor chips 200, and the second semiconductor chips 200 may be a core chip including DRAM memory cells. In some embodiments, the first semiconductor chip 100 may be referred to as a master chip, and each of the second semiconductor chips 200 may be referred to as a slave chip.

The first front wiring structure 120 and the second front wiring structure 220 may each include a metal material, for example, aluminum, copper, or tungsten. In some embodiments, the first front wiring structure 120 and the second front wiring structure 220 may each include a barrier film for wiring and a metal layer for wiring. The barrier film for wiring may include a metal, a metal nitride, or an alloy.

The second front wiring structure 220 may include a plurality of second front wiring patterns 222, and a plurality of second front wiring vias 224 connected to the second front wiring patterns 222. In some embodiments, the second front wiring patterns 222 may each have a thickness of about 0.5 μm or less. In some embodiments, the second front wiring structure 220 may be a multilayer wiring structure including the second front wiring patterns 222 located at different vertical levels and the second front wiring vias 224.

The second semiconductor chips 200 may include a second front inter-wiring insulating layer 226 surrounding the second front wiring structure 220. When the second front wiring structure 220 has a multilayer wiring structure, the second front inter-wiring insulating layer 226 may have a multilayer structure in which a plurality of insulating layers are stacked, corresponding to the multilayer wiring structure of the second front wiring structure 220. For example, the second front inter-wiring insulating layer 226 may include a silicon oxide, a silicon nitride, a silicon oxynitride, an insulating polymer, or a combination thereof.

Similar to the second semiconductor chips 200 including the second front wiring structure 220 having the second front wiring patterns 222 and the second front wiring vias 224 and the second front inter-wiring insulating layer 226 surrounding the second front wiring structure 220, the first semiconductor chip 100 may include the first front wiring structure 120 having a plurality of first front wiring patterns and a plurality of first front wiring vias connected to the first front wiring patterns and a first front inter-wiring insulating layer surrounding the first front wiring structure 120.

The first through electrodes 130 and the second through electrodes 230 may each be formed as a through silicon via (TSV). Each of the first through electrodes 130 and the second through electrodes 230 may include a conductive plug penetrating each of the first semiconductor substrate 110 and the second semiconductor substrate 210 and a conductive barrier film surrounding the conductive plug. The conductive plug may have a cylindrical shape, and the conductive barrier film may have a cylinder shape surrounding a side wall of the conductive plug. A via insulating film is arranged between the first through electrodes 130 and the first semiconductor substrate 110, and between the second through electrodes 230 and the second semiconductor substrate 210, to surround the side walls of the first through electrodes 130 and the second through electrodes 230. The first through electrodes 130 and the second through electrodes 230 may each be formed in any one of a via-first, via-middle, or via-last structure.

The first rear wiring structure 150 and the second rear wiring structure 250 may each include a metal material, for example, aluminum, copper, or tungsten. In some embodiments, the first rear wiring structure 150 and the second rear wiring structure 250 may each include a barrier film for wiring and a metal layer for wiring.

The first rear wiring structure 150 may include a plurality of first rear wiring patterns 152, and a plurality of first rear wiring vias 154 connected to the first rear wiring patterns 152. The second rear wiring structure 250 may include a plurality of second rear wiring patterns 252, and a plurality of second rear wiring vias 254 connected to the second rear wiring patterns 252. In some embodiments, the first rear wiring patterns 152 and the second rear wiring patterns 252 may each have a thickness of about 0.5 μm or less. In some embodiments, the first rear wiring structure 150 may have a multilayer wiring structure including the first rear wiring patterns 152 located at different vertical levels and the first rear wiring vias 154, and the second rear wiring structure 250 may have a multilayer wiring structure including the second rear wiring patterns 252 located at different vertical levels and the second rear wiring vias 254.

The first semiconductor chip 100 may include a first rear inter-wiring insulating layer 156 surrounding the first rear wiring structure 150, and the second semiconductor chips 200 may each include a second rear inter-wiring insulating layer 256 surrounding the second rear wiring structure 250. When the first rear wiring structure 150 is a multilayer wiring structure, the first rear inter-wiring insulating layer 156 may have a multilayer structure in which a plurality of insulating layers are stacked, corresponding to the multilayer wiring structure of the first rear wiring structure 150, and when the second rear wiring structure 250 is a multilayer wiring structure, the second rear inter-wiring insulating layer 256 may have a multilayer structure in which a plurality of insulating layers are stacked, corresponding to the multilayer wiring structure of the second rear wiring structure 250.

For example, the first rear inter-wiring insulating layer 156 and the second rear inter-wiring insulating layer 256 may each include a silicon oxide, a silicon nitride, a silicon oxynitride, an insulating polymer, or a combination thereof. For example, at least a portion of each of the first rear inter-wiring insulating layer 156 and the second rear inter-wiring insulating layer 256 may include a polymer formed from photosensitive polyimide (PSPI). For example, the first rear inter-wiring insulating layer 156 and the second rear inter-wiring insulating layer 256 may each have a multilayer structure in which a layer including a nitride and a layer formed from PSPI are stacked. Alternatively, for example, the first rear inter-wiring insulating layer 156 and the second rear inter-wiring insulating layer 256 may each have a multilayer structure in which a layer including a nitride and a layer formed of tetraethyl orthosilicate (TEOS) are stacked. For example, the first rear inter-wiring insulating layer 156 and the second rear inter-wiring insulating layer 256 may each have a thickness of about 2 μm to about 5 μm.

A first rear cover layer 190 may be formed on the first rear wiring structure 150. The first rear cover layer 190 may include a first lower rear cover layer 192 covering the first rear wiring structure 150, and a first upper rear cover layer 194 covering the first lower rear cover layer 192.

A front cover layer 280 may be formed on the second front wiring structure 220. The front cover layer 280 may include a lower (first) front cover layer 282 covering the second front wiring structure 220, and an upper (second) front cover layer 284 covering the lower front cover layer 282.

A second rear cover layer 290 may be formed on the second rear wiring structure 250. The second rear cover layer 290 may include a second lower rear cover layer 292 covering the second rear wiring structure 250, and a second upper rear cover layer 294 covering the second lower rear cover layer 292.

The first rear cover layer 190 and the second rear cover layer 290 may have substantially the same structure, except that the first rear cover layer 190 is located on the rear surface of the first semiconductor chip 100, and that the second rear cover layer 290 is located on the rear surface of the second semiconductor chips 200. The first rear cover layer 190 and the second rear cover layer 290 may each be referred to as a rear cover layer, the first lower rear cover layer 192 and the second lower rear cover layer 292 may each be referred to as a lower rear cover layer, and the first upper rear cover layer 194 and the second upper rear cover layer 294 may each be referred to as an upper rear cover layer.

The first lower rear cover layer 192, the lower front cover layer 282, and the second lower rear cover layer 292 may each include any one material of SiO, SiN, SiCN, and SiCO. The first upper rear cover layer 194, the upper front cover layer 284, and the second upper rear cover layer 294 may each include any one material of SiO, SiN, SiCN, SiCO, and a polymer material. For example, the polymer material may include benzocyclobutene (BCB), polyimide (PI), polybenzoxazole (PBO), silicone, acrylate, or epoxy. In some embodiments, the first lower rear cover layer 192, the lower front cover layer 282, and the second lower rear cover layer 292 may each include the same material, and the first upper rear cover layer 194, the upper front cover layer 284, and the second upper rear cover layer 294 may each include the same material. In some embodiments, the material forming the first lower rear cover layer 192, the lower front cover layer 282, and the second lower rear cover layer 292 may be different from the material forming the first upper rear cover layer 194, the upper front cover layer 284, and the second upper rear cover layer 294.

A first rear dummy conductive layer 170 may be disposed in the first lower rear cover layer 192, a front dummy conductive layer 260 may be disposed in the lower front cover layer 282, and a second rear dummy conductive layer 270 may be disposed in the second lower rear cover layer 292. The first rear dummy conductive layer 170, the front dummy conductive layer 260, and the second rear dummy conductive layer 270 may be formed to penetrate the first lower rear cover layer 192, the lower front cover layer 282, and the second lower rear cover layer 292, respectively. In some embodiments, the upper surfaces and the lower surfaces of the first rear dummy conductive layer 170, the front dummy conductive layer 260, and the second rear dummy conductive layer 270 may be located at the same vertical levels of the upper surfaces and the lower surfaces of the first lower rear cover layer 192, the lower front cover layer 282, and the second lower rear cover layer 292, respectively, to be coplanar.

The first rear dummy conductive layer 170 may include a first rear wide dummy pattern 172 and a first rear narrow dummy pattern 174. The front dummy conductive layer 260 may include a front wide dummy pattern 262 and a front narrow dummy pattern 264. The second rear dummy conductive layer 270 may include a second rear wide dummy pattern 272 and a second rear narrow dummy pattern 274.

The first rear dummy conductive layer 170 and the second rear dummy conductive layer 270 may have substantially the same structure, except that the first rear dummy conductive layer 170 is located on the rear surface of the first semiconductor chip 100, and that the second rear dummy conductive layer 270 is located on the rear surface of the second semiconductor chips 200. The first rear dummy conductive layer 170 and the second rear dummy conductive layer 270 may each be referred to as a rear dummy conductive layer, the first rear wide dummy pattern 172 and the second rear wide dummy pattern 272 may each be referred to as a rear wide dummy pattern, and the first rear narrow dummy pattern 174 and the second rear narrow dummy pattern 274 may each be referred to as a rear narrow dummy pattern.

The first rear wide dummy pattern 172 and the front wide dummy pattern 262 that are opposite to each other may overlap each other in the vertical direction, and the second rear wide dummy pattern 272 and the front wide dummy pattern 262 that are opposite to each other may overlap each other in the vertical direction. The first rear wide dummy pattern 172 and the front wide dummy pattern 262 that are opposite to each other may have the same horizontal width, and the second rear wide dummy pattern 272 and the front wide dummy pattern 262 that are opposite to each other may have the same horizontal width. The first rear narrow dummy pattern 174 and the front narrow dummy pattern 264 that are opposite to each other may overlap each other in the vertical direction, and the second rear narrow dummy pattern 274 and the front narrow dummy pattern 264 that are opposite to each other may overlap each other in the vertical direction. The first rear narrow dummy pattern 174 and the front narrow dummy pattern 264 that are opposite to each other may have the same horizontal width, and the second rear narrow dummy pattern 274 and the front narrow dummy pattern 264 that are opposite to each other may have the same horizontal width.

The first upper rear cover layer 194 of the first semiconductor chip 100 and the upper front cover layer 284 of the second semiconductor chips 200 that are in contact with reach other may be bonded to each other to integrally form a first bonding cover layer BI1, and the second upper rear cover layer 294 and the upper front cover layer 284 of the two second semiconductor chips 200 in contact with each other may be bonded to each other to integrally form a second bonding cover layer BI2.

A plurality of first dummy bonded pads DBP1 may be disposed in the first upper rear cover layer 194 and the upper front cover layer 284 in contact with each other, that is, in the first bonding cover layer BI1, and a plurality of second dummy bonded pads DBP2 may be disposed in the second upper rear cover layer 294 and the upper front cover layer 284 in contact with each other, that is, in the second bonding cover layer BI2.

The first dummy bonded pads DBP1 may each be formed to penetrate the first bonding cover layer BI1, and the second dummy bonded pads DBP2 may each be formed to penetrate the second bonding cover layer BI2. In some embodiments, the upper surfaces and the lower surfaces of the first dummy bonded pads DBP1 may be located at the same vertical levels of the upper surface and the lower surface of the first bonding cover layer BI1, to be coplanar, and the upper surfaces and the lower surfaces of the second dummy bonded pads DBP2 may be located at the same vertical levels of the upper surface and the lower surface of the second bonding cover layer BI2, to be coplanar.

The first bonding cover layer BI1 and the first dummy bonded pads DBP1 are arranged between the first semiconductor chip 100 and the second semiconductor chip 200 at the bottom of the second semiconductor chips 200. The first bonding cover layer BI1 and the second bonding cover layer BI2 may have substantially the same structure, and the first dummy bonded pads DBP1 and the second dummy bonded pads DBP2 may have substantially the same structure, except that the second bonding cover layer BI2 and the second dummy bonded pads DBP2 are arranged between the two second semiconductor chips 200 adjacent to each other in the vertical direction. The first bonding cover layer BI1 and the second bonding cover layer BI2 may each be referred to as a bonding cover layer. The first dummy bonded pads DBP1 and the second dummy bonded pads DBP2 may each be referred to as a dummy bonded pad.

The first dummy bonded pads DBP1 may be arranged between the first rear dummy conductive layer 170 and the front dummy conductive layer 260, and the second dummy bonded pads DBP2 may be arranged between the second rear dummy conductive layer 270 and the front dummy conductive layer 260. For example, some of the first dummy bonded pads DBP1 may be arranged between the first rear wide dummy pattern 172 and the front wide dummy pattern 262 that are opposite to each other, and some other of the first dummy bonded pads DBP1 may be arranged between the first rear narrow dummy pattern 174 and the front narrow dummy pattern 264 that are opposite to each other. Some of the second dummy bonded pads DBP2 may be arranged between the second rear wide dummy pattern 272 and the front wide dummy pattern 262 that are opposite to each other, and some other of the second dummy bonded pads DBP2 may be arranged between the second rear narrow dummy pattern 274 and the front narrow dummy pattern 264 that are opposite to each other.

The first rear wide dummy pattern 172, the first dummy bonded pads DBP1, and the front wide dummy pattern 262 that are connected to one another may form a first wide dummy pad structure WP1 (see, e.g., FIG. 2B), the first rear narrow dummy pattern 174, the first dummy bonded pads DBP1, and the front narrow dummy pattern 264 that are connected to one another may form a first narrow dummy pad structure NP1 (see, e.g., FIG. 2B), the second rear wide dummy pattern 272, the second dummy bonded pads DBP2, and the front wide dummy pattern 262 that are connected to one another may form a second wide dummy pad structure WP2 (see, e.g., FIG. 2D), and the second rear narrow dummy pattern 274, the second dummy bonded pads DBP2, and the front narrow dummy pattern 264 that are connected to one another may form a second narrow dummy pad structure NP2 (see, e.g., FIG. 2D). The first wide dummy pad structure WP1 and the first narrow dummy pad structure NP1 together may be referred to as a first dummy pad structure DP1, and the second wide dummy pad structure WP2 and the second narrow dummy pad structure NP2 together may be referred to as a second dummy pad structure DP2.

In some embodiments, each of the first wide dummy pad structure WP1, the first narrow dummy pad structure NP1, the second wide dummy pad structure WP2, and the second narrow dummy pad structure NP2 may be completely surrounded by an insulating material to be electrically floated. For example, each of the first wide dummy pad structure WP1 and the first narrow dummy pad structure NP1 is electrically floated by being completely surrounded by the first rear inter-wiring insulating layer 156, the first rear cover layer 190, the front cover layer 280, and the second front inter-wiring insulating layer 226. For example, each of the second wide dummy pad structure WP2 and the second narrow dummy pad structure NP2 is electrically floated by being completely surrounded by the second rear inter-wiring insulating layer 256, the second rear cover layer 290, the front cover layer 280, and the second front inter-wiring insulating layer 226.

In some embodiments, at least one of the first wide dummy pad structure WP1, the first narrow dummy pad structure NP1, the second wide dummy pad structure WP2 and the second narrow dummy pad structure NP2 may be grounded. For example, at least one of the first wide dummy pad structure WP1 and the first narrow dummy pad structure NP1 may be grounded through the first rear wiring structure 150 and/or the second front wiring structure 220. For example, at least one of the second wide dummy pad structure WP2 and the second narrow dummy pad structure NP2 may be grounded through the second rear wiring structure 250 and/or the second front wiring structure 220.

The first bonded pads BP1, the second through electrodes 230, and the second bonded pads BP2, which correspond to one of the first through electrodes 130, may all be aligned in the vertical direction and arranged on a straight line extending in the vertical direction. The first through electrodes 130 and the second through electrodes 230 corresponding to each other may overlap the first bonded pads BP1 and the second bonded pads BP2 corresponding to each other, in the vertical direction.

At least one first rear wide dummy pattern 172 and the first rear narrow dummy patterns 174 included in the first rear dummy conductive layer 170, at least one front wide dummy pattern 262 and the front narrow dummy patterns 264 included in the front dummy conductive layer 260, at least one second rear wide dummy pattern 272 and the second rear narrow dummy patterns 274 included in the second rear dummy conductive layer 270, and each of the first dummy bonded pads DBP1 and the second dummy bonded pads DBP2 may not overlap the first through electrodes 130 and the second through electrodes 230 in the vertical direction.

The first rear dummy conductive layer 170, the front dummy conductive layer 260, the second rear dummy conductive layer 270, the first dummy bonded pads DBP1 and the second dummy bonded pads DBP2 may be separated from the first bonded pads BP1 and the second bonded pads BP2. For example, the first rear dummy conductive layer 170, the front dummy conductive layer 260, the second rear dummy conductive layer 270, the first dummy bonded pads DBP1, and the second dummy bonded pads DBP2 may be separated in the horizontal direction from the first bonded pads BP1 and the second bonded pads BP2 with the first lower rear cover layer 192, the lower front cover layer 282, and the second lower rear cover layer 292 therebetween. The first rear dummy conductive layer 170, the front dummy conductive layer 260, the second rear dummy conductive layer 270, the first dummy bonded pads DBP1 and the second dummy bonded pads DBP2 may each include a material containing Cu or a material containing Al.

The first bonded pads BP1 may penetrate the first rear cover layer 190 and the front cover layer 280, and may electrically connect the first through electrodes 130 to the second through electrodes 230 corresponding to each other. The second bonded pads BP2 may penetrate the front cover layer 280 and the second rear cover layer 290, and may electrically connect the second through electrodes 230 corresponding to each other of any one second semiconductor chip of the second semiconductor chips 200 and another second semiconductor chip.

The first bonded pads BP1 may extend into the first rear inter-wiring insulating layer 156 so that one end of each of the first bonded pads BP1 may be electrically connected to the first rear wiring structure 150, and extend into the second front inter-wiring insulating layer 226 so that the other end of each of the first bonded pads BP1 may be electrically connected to the second front wiring structure 220. The second bonded pads BP2 may extend into the second rear inter-wiring insulating layer 256 of any one second semiconductor chip of the second semiconductor chips 200 so that one end of each of the second bonded pads BP2 may be electrically connected to the second rear wiring structure 250, and extend into the second front inter-wiring insulating layer 226 of another second semiconductor chip of the second semiconductor chips 200 so that the other end of each of the second bonded pads BP2 may be electrically connected to the second front wiring structure 220.

A first rear under bump metallurgy (UBM) layer 148 may be arranged between one end of each of the first bonded pads BP1 and the first rear wiring structure 150, and a front UBM layer 246 may be arranged between the other end of the first bonded pads BP1 and the second front wiring structure 220. In some embodiments, one end of each of the first bonded pads BP1 may be in contact with one of the first rear wiring patterns 152 with a first rear UBM layer 148 therebetween, and the other end of each of the first bonded pads BP1 may be in contact with one of the second front wiring patterns 222 with the front UBM layer 246 therebetween. A second rear UBM layer 248 may be arranged between one end of each of the second bonded pads BP2 and the second rear wiring structure 250 of any one second semiconductor chip of the second semiconductor chips 200, and the front UBM layer 246 may be arranged between the other end of each of the second bonded pads BP2 and the second front wiring structure 220 of another second semiconductor chip of the second semiconductor chips 200. In some embodiments, one end of each of the second bonded pads BP2 may be in contact with one of the second rear wiring patterns 252 of any one second semiconductor chip of the second semiconductor chips 200 with the second rear UBM layer 248 therebetween, and the other end of each of the second bonded pads BP2 may be in contact with one of the second front wiring patterns 222 of another second semiconductor chip of the second semiconductor chips 200 with the front UBM layer 246 therebetween.

A portion of each of the first bonded pads BP1 extending into the first rear inter-wiring insulating layer 156 by penetrating the first rear cover layer 190 may be referred to as a first lower pad portion BP1L, and another portion thereof extending into the second front inter-wiring insulating layer 226 by penetrating the front cover layer 280 may be referred to as a first upper pad portion BP1H. The first lower pad portion BP1L and the first upper pad portion BP1H corresponding to each other may form one body. A portion of each of the second bonded pads BP2 extending into the second rear inter-wiring insulating layer 256 by penetrating the second rear cover layer 290 may be referred to as a second lower pad portion BP2L, and another portion thereof extending into the second front inter-wiring insulating layer 226 by penetrating the front cover layer 280 may be referred to as a second upper pad portion BP2H. The second lower pad portion BP2L and the second upper pad portion BP2H corresponding to each other may form one body.

A portion of each of the first dummy bonded pads DBP1 penetrating the first upper rear cover layer 194 may be referred to as a first lower dummy pad portion DBP1L, and another portion thereof penetrating the upper front cover layer 284 may be referred to as a first upper dummy pad portion DBP1H. The first lower dummy pad portion DBP1L and the first upper dummy pad portion DBP1H corresponding to each other may form one body. A portion of each of the second dummy bonded pads DBP2 penetrating the second upper rear cover layer 294 may be referred to as a second lower dummy pad portion DBP2L, and another portion thereof penetrating the upper front cover layer 284 may be referred to as a second upper dummy pad portion DBP2H. The second lower dummy pad portion DBP2L and the second upper dummy pad portion DBP2H corresponding to each other may form one body.

For example, the first bonded pads BP1, the second bonded pads BP2, the first dummy bonded pads DBP1, and the second dummy bonded pads DBP2 may each include a material containing Cu.

Each of the first bonded pads BP1 may be formed through diffusion bonding by separately forming a portion penetrating the first rear cover layer 190 of the first semiconductor chip 100 and a portion penetrating the front cover layer 280 of the second semiconductor chips 200, allowing the portions to thermally expand to be in contact with each other, and then forming one body through diffusion of metal atoms included in the portions. Each of the second bonded pads BP2 may be formed through diffusion bonding by separately forming a portion penetrating the second rear cover layer 290 of any one second semiconductor chip of the second semiconductor chips 200 and a portion penetrating the front cover layer 280 of another second semiconductor chip of the second semiconductor chips 200, allowing the portions to thermally expand to be in contact with each other, and then forming one body through diffusion of metal atoms included in the portions.

Each of the first dummy bonded pads DBP1 may be formed through diffusion bonding by separately forming a portion penetrating the first upper rear cover layer 194 of the first semiconductor chip 100 and a portion penetrating the upper front cover layer 284 of the second semiconductor chips 200, allowing the portions to thermally expand to be in contact with each other, and then forming one body through diffusion of metal atoms included in the portions. Each of the second dummy bonded pads DBP2 may be formed through diffusion bonding by separately forming a portion penetrating the second upper rear cover layer 294 of any one second semiconductor chip of the second semiconductor chips 200 and a portion penetrating the upper front cover layer 284 of another second semiconductor chip of the second semiconductor chips 200, allowing the portions to thermally expand to be in contact with each other, and then forming one body through diffusion of metal atoms included in the portions.

In some embodiments, the first upper rear cover layer 194 of the first semiconductor chip 100 and the upper front cover layer 284 of the second semiconductor chips 200 that are in contact with each other may be bonded to each other in a process of forming the first bonded pads BP1 and the first dummy bonded pads DBP1, thereby integrally forming the first bonding cover layer BI1, and the second upper rear cover layer 294 and the upper front cover layer 284 of each of the two second semiconductor chips 200 in contact with each other may be bonded in a process of forming the second bonded pads BP2 and the second dummy bonded pads DBP2, thereby integrally forming the second bonding cover layer BI2.

The first lower rear cover layer 192 may have a first thickness T1, and the first upper rear cover layer 194 may have a second thickness T2. The first thickness T1 may have a value equal to or greater than the second thickness T2. For example, the first thickness T1 may have a value of about 50% to about 70% of the sum of the first thickness T1 and the second thickness T2. The upper front cover layer 284 may have a third thickness T3, and the lower front cover layer 282 may have a fourth thickness T4. The fourth thickness T4 may have a value equal to or greater than the third thickness T3. For example, the fourth thickness T4 may have a value of about 50% to about 70% of the sum of the third thickness T3 and the fourth thickness T4. The second lower rear cover layer 292 may have a fifth thickness $T1a$, and the second upper rear cover layer 294 may have a sixth thickness $T2a$. The fifth thickness $T1a$ may have a value equal to or greater than the sixth thickness $T2a$. For example, the fifth thickness $T1a$ may have a value of about 50% to about 70% of the sum of the fifth thickness $T1a$ and the sixth thickness $T2a$.

In some embodiments, the first thickness T1 and the fifth thickness $T1a$ may have substantially the same value, and the second thickness T2 and the sixth thickness $T2a$ may have substantially the same value. In some embodiments, the first thickness T1 and the fourth thickness T4 may have substantially the same or approximately similar value, and the second thickness T2 and the third thickness T3 may have substantially the same or approximately similar value. For example, each of the first thickness T1, the fourth thickness T4, and the fifth thickness $T1a$ may be about 0.2 µm to about 1 µm. For example, the sum of the first thickness T1, the second thickness T2, the third thickness T3, and the fourth thickness T4 may be about 0.7 µm to about 4 µm. For example, the sum of the fifth thickness $T1a$, the sixth thickness $T2a$, the third thickness T3, and the fourth thickness T4 may be about 0.7 µm to about 4 µm.

The lower surface of the first bonded pads BP1 may be located at a first vertical level LV1, the lower surface of the first rear dummy conductive layer 170 may be located at a second vertical level LV2 higher than the first vertical level LV1, the upper surface of the front dummy conductive layer 260 of the second semiconductor chips 200 adjacent to the first semiconductor chip 100 may be located at a third vertical level LV3 higher than the second vertical level LV2, and the upper surface of the first bonded pads BP1 may be located at a fourth vertical level LV4 higher than the third vertical level LV3.

Between the two second semiconductor chips 200 adjacent to each other, the lower surface of the second bonded pads BP2 may be located at a fifth vertical level LV1a, the lower surface of the second rear dummy conductive layer 270 may be located at a sixth vertical level LV2a higher than the fifth vertical level LV1a, the upper surface of the front dummy conductive layer 260 may be located at a seventh vertical level LV3a higher than the sixth vertical level LV2a, and the upper surface of the second bonded pads BP2 may be located at an eighth vertical level LV4a higher than the seventh vertical level LV3a. In some embodiments, the height of each of the second vertical level LV2, the third vertical level LV3, and the fourth vertical level LV4 based on the first vertical level LV1 may have substantially the same value as the height of each of the sixth vertical level LV2a, the seventh vertical level LV3a, and the eighth vertical level LV4a based on the fifth vertical level LV1a.

The first bonded pads BP1 may each have a first height H1, and the second bonded pads BP2 may each have a second height H2. In some embodiments, the first height H1 and the second height H2 may have substantially the same value. For example, the first height H1 and the second height H2 may each have a value of about 0.8 μm to about 4.2 μm.

The first rear dummy conductive layer 170 may have the first thickness T1, the front dummy conductive layer 260 may have the fourth thickness T4, and the second rear dummy conductive layer 270 may have the fifth thickness T1a. In some embodiments, the sum of the first thickness T1, the second thickness T2, the third thickness T3, and the fourth thickness T4 may have a value less than the first height H1, and the sum of the fifth thickness T1a, and the sixth thickness T2a, the third thickness T3, and the fourth thickness T4 may have a value less than the second height H2. In some embodiments, the first height H1 may have a value that is twice or less than the sum of the first thickness T1 and the fourth thickness T4, and the second height H2 may have a value that is twice or less than the sum of the fifth thickness T1a and the fourth thickness T4.

The first lower dummy pad portion DBP1L may have the second thickness T2, and the first upper dummy pad portion DBP1H may have the third thickness T3. Accordingly, the first dummy bonded pads DBP1 may have a thickness of the sum of the second thickness T2 and the third thickness T3. The second lower dummy pad portion DBP2L may have the sixth thickness T2a, and the second upper dummy pad portion DBP2H may have the third thickness T3. Accordingly, the second dummy bonded pads DBP2 may have the thickness of the sum of the sixth thickness T2a and the third thickness T3.

The first rear dummy conductive layer 170 and the first dummy bonded pads DBP1 may both overlap the first bonded pads BP1 in the horizontal direction, the front dummy conductive layer 260 may both overlap the first bonded pads BP1 or the second bonded pads BP2 in the horizontal direction, and the second rear dummy conductive layer 270 and the second dummy bonded pads DBP2 may both overlap the second bonded pads BP2 in the horizontal direction.

The first bonded pads BP1, the second bonded pads BP2, the first dummy bonded pads DBP1, and the second dummy bonded pads DBP2 may each have the same first horizontal width W1 (see, e.g., FIGS. 2B and 2D). For example, the first horizontal width W1 may be about 0.5 μm to about 8 μm.

The first rear wide dummy pattern 172, the front wide dummy pattern 262, and the second rear wide dummy pattern 272 may each have a second horizontal width W2 greater than the first horizontal width W1. The first rear narrow dummy pattern 174, the front narrow dummy pattern 264, the second rear narrow dummy pattern 274 may each have a third horizontal width W3 that is less than each of the first horizontal width W1 and the second horizontal width W2.

The first bonded pads BP1 and the first dummy bonded pads DBP1 located between the first semiconductor chip 100 and the second semiconductor chip 200 at the bottom of the second semiconductor chips 200 may be arranged at the same pitch PT. The second bonded pads BP2 and the second dummy bonded pads DBP2 located between the two second semiconductor chips 200 adjacent to each other in the vertical direction may be arranged at the same pitch PT.

In some embodiments, the first rear wide dummy pattern 172, the first rear narrow dummy pattern 174, and a portion of the first lower pad portion BP1L located in the first lower rear cover layer 192 between the first semiconductor chip 100 and the second semiconductor chip 200 at the bottom of the second semiconductor chips 200, the front wide dummy pattern 262, the front wide dummy pattern 262, and a portion of the first upper pad portion BP1H located in the lower front cover layer 282 between the first semiconductor chip 100 and the second semiconductor chip 200 at the bottom of the second semiconductor chips 200, the second rear wide dummy pattern 272, the second rear narrow dummy pattern 274, and a portion of the second lower pad portion BP2L located in the second lower rear cover layer 292 between the two second semiconductor chips 200 adjacent to each other in the vertical direction, and the front wide dummy pattern 262, the front wide dummy pattern 262, and a portion of the second upper pad portion BP2H located in the lower front cover layer 282 between the two second semiconductor chips 200 adjacent to each other in the vertical direction may be arranged at the same pitch PT, but embodiments of the disclosure are not limited thereto, and at least some of the above-described elements may be arranged at another pitch.

In the semiconductor package 1000 according to one or more embodiments of the disclosure, the first rear wide dummy pattern 172, the front wide dummy pattern 262, the second rear wide dummy pattern 272, the second rear narrow dummy pattern 274, the front narrow dummy pattern 264, and the first rear narrow dummy pattern 174, which have a different horizontal width from the first bonded pads BP1 and the second bonded pads BP2, may be connected to the first dummy bonded pads DBP1 and the second dummy bonded pads DBP2 having the same horizontal width as the first bonded pads BP1 and the second bonded pads BP2. The first bonded pads BP1 and the first dummy bonded pads DBP1, and the second bonded pads BP2 and the second dummy bonded pads DBP2, have the same horizontal width and are arranged at the same pitch. Accordingly, in a process of forming the first bonded pads BP1 and the first dummy bonded pads DBP1, and the second bonded pads BP2 and the second dummy bonded pads DBP2, voids may be prevented from being generated in the first bonded pads BP1 and the first dummy bonded pads DBP1, and the second dummy bonded pads DBP2 and the second bonded pads BP2, and thus, the reliability of a semiconductor package may be improved.

Furthermore, as the first dummy bonded pads DBP1 and the second dummy bonded pads DBP2 may function as a heat transfer path between the first semiconductor chip 100 and the second semiconductor chips 200, heat dissipation performance of the semiconductor package 1000 may be improved.

FIGS. 3A to 3G are cross-sectional views showing, step by step, a method of manufacturing a semiconductor package, according to an embodiment. In detail, FIGS. 3A to 3G are enlarged cross-sectional views of the region IIa of FIG. 1, that is, a portion corresponding to FIG. 2A.

Figure 3A:
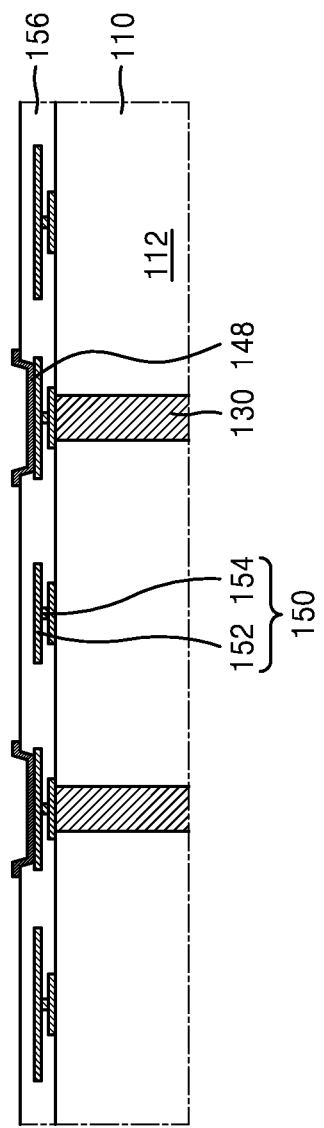
FIGS. 3A to 3G are cross-sectional views showing a method of manufacturing a semiconductor package, according to an embodiment.

Referring to FIG. 3A, the first through electrodes 130, the first semiconductor device 112, and the first rear wiring structure 150 connected to the first through electrodes 130 are formed in and on the first semiconductor substrate 110.

The first through electrodes 130 may penetrate the first semiconductor substrate 110, the first semiconductor device 112 may be formed in the active surface of the first semiconductor substrate 110, and the first rear wiring structure 150 may be formed on the inactive surface of the first semiconductor substrate 110.

The first rear wiring structure 150 may include the first rear wiring patterns 152 and the first rear wiring vias 154 connected to the first rear wiring patterns 152, and may be surrounded by the first rear inter-wiring insulating layer 156. The first rear wiring structure 150 may be formed such that each of the first through electrodes 130 be connected to one portion of each of the first rear wiring patterns 152. As a portion of the first rear inter-wiring insulating layer 156 is removed, the other portion of each of the first rear wiring patterns 152 may be exposed. The first rear UBM layer 148 may be formed on the other portion of each of the first rear wiring patterns 152 that are exposed, but not covered by the first rear inter-wiring insulating layer 156. The first rear UBM layer 148 may be formed the other portion of each of the first rear wiring patterns 152 and a portion of the first rear inter-wiring insulating layer 156 adjacent thereto. In some embodiments, a portion located at the lowest level of the upper surface of the first rear UBM layer 148 may be lower than the level of the upper surface of the first rear inter-wiring insulating layer 156.

Figure 3B:
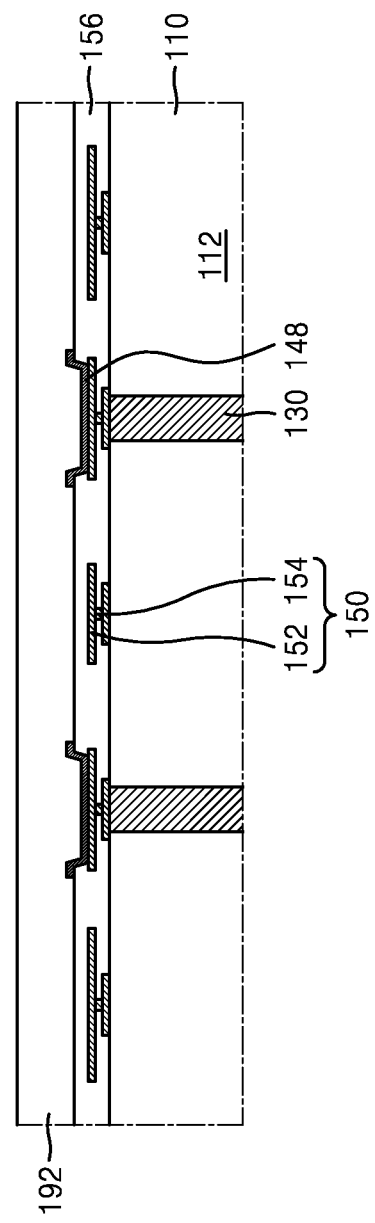

Referring to FIG. 3B, the first lower rear cover layer 192 that covers the first rear wiring structure 150, the first rear inter-wiring insulating layer 156, and the first rear UBM layer 148 may be formed. The first lower rear cover layer 192 may include any one material of SiO, SiN, SiCN, and SiCO. The first lower rear cover layer 192 may be formed to have a value of about 0.2 μm to 1 μm.

Figure 3C:
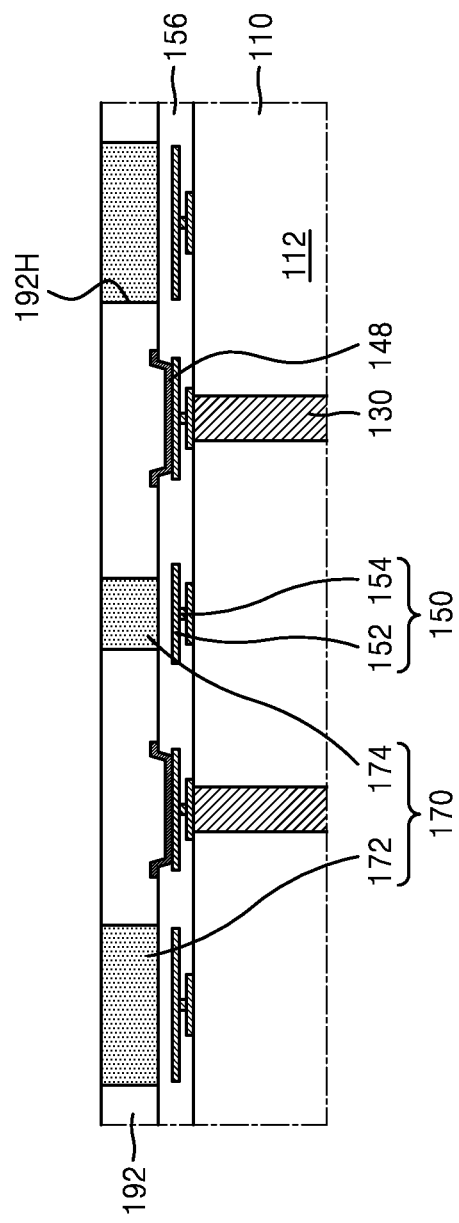

Referring to FIG. 3C, by removing a portion of the first lower rear cover layer 192, a plurality of first holes 192H are formed such that the first rear inter-wiring insulating layer 156 is exposed through each lower surface thereof, and then, the first rear dummy conductive layer 170 filling the first holes 192H is formed. The first rear dummy conductive layer 170 may include the first rear wide dummy pattern 172 and the first rear narrow dummy pattern 174. The first rear wide dummy pattern 172 and the first rear narrow dummy pattern 174 may have different horizontal widths. For example, the first rear wide dummy pattern 172 may have a second horizontal width (W2 of FIG. 2B), and the first rear narrow dummy pattern 174 may have a third horizontal width (W3 of FIG. 2B). The first rear dummy conductive layer 170 may include a material containing Cu or a material containing Al.

In some embodiments, the first rear dummy conductive layer 170 may be formed by performing a damascene process of forming a first conductive material layer covering the first lower rear cover layer 192 by filling the first holes 192H and then removing a portion of the first conductive material layer until the upper surface of the first lower rear cover layer 192 is exposed.

Figure 3D:
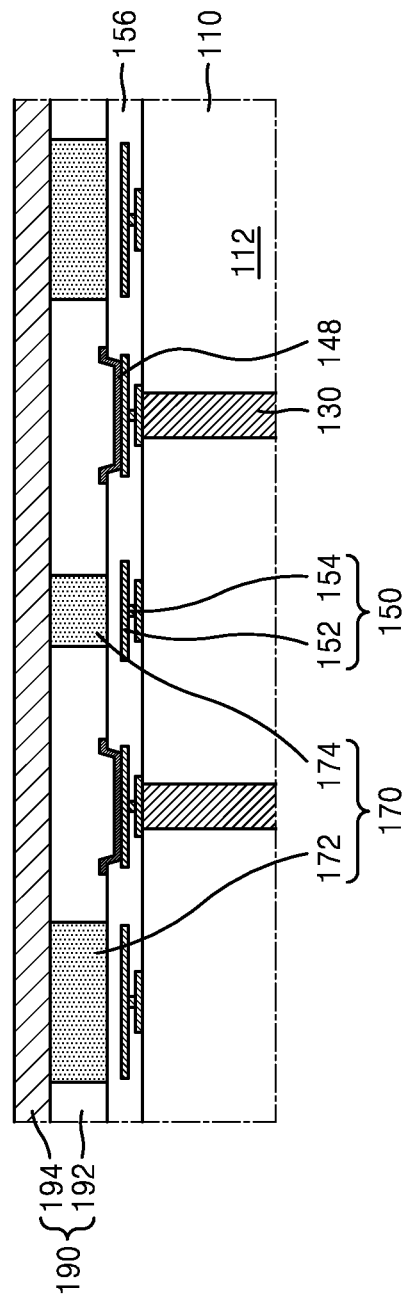

Referring to FIG. 3D, the first upper rear cover layer 194 covering the first lower rear cover layer 192 and the first rear dummy conductive layer 170 is formed. The first upper rear cover layer 194 may include any one material of SiO, SiN, SiCN, SiCO, and a polymer material. The first upper rear cover layer 194 may be formed to have a thickness equal to or less than the thickness of the first lower rear cover layer 192.

The first lower rear cover layer 192 and the first upper rear cover layer 194 together may be referred to as the first rear cover layer 190. In some embodiments, when the first lower rear cover layer 192 and the first upper rear cover layer 194 include the same material, the first lower rear cover layer 192 and the first upper rear cover layer 194 may be integrally formed in the first rear cover layer 190 without distinction.

Figure 3E:
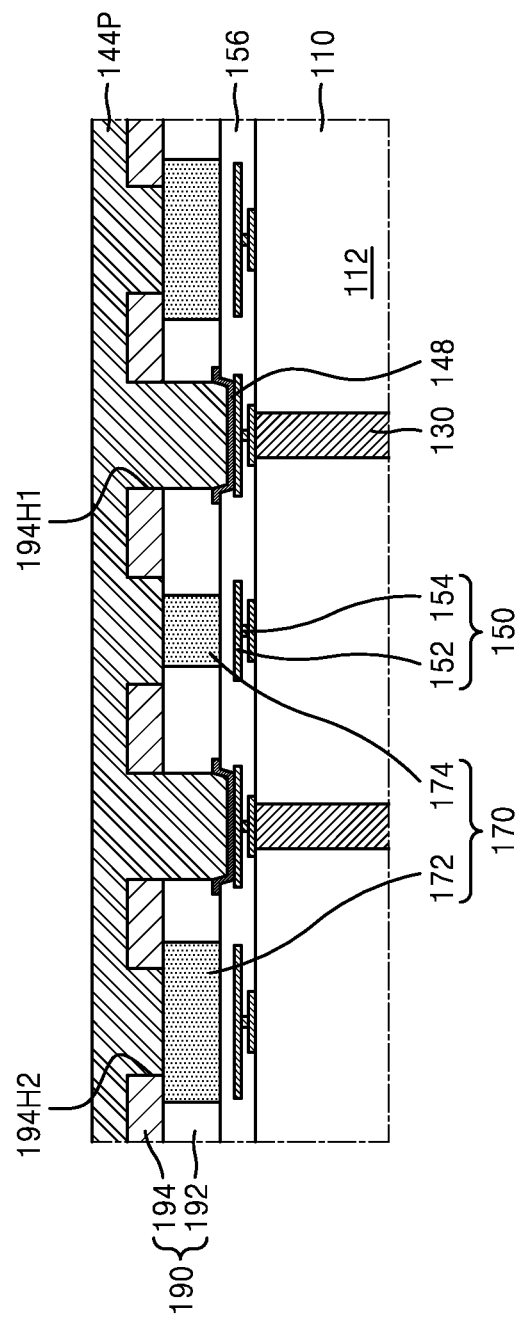

Referring to FIG. 3E, by removing portions of the first upper rear cover layer 194 and the first lower rear cover layer 192, a plurality of second holes 194H1 are formed such that the first rear UBM layer 148 is exposed through each lower surface thereof, and a plurality of third holes 194H2 are formed such that the first rear dummy conductive layer 170 is exposed through each lower surface thereof. Each of the second holes 194H1 may expose the first rear UBM layer 148 in the lower surface thereof, by penetrating the first rear cover layer 190 including the first upper rear cover layer 194 and the first lower rear cover layer 192. Each of the third holes 194H2 may expose any one of the first rear wide dummy pattern 172 and the first rear narrow dummy pattern 174 in the lower surface thereof, by penetrating the first upper rear cover layer 194. The depth of the second holes 194H1 from the upper surface of the first upper rear cover layer 194 may be greater than the depth of the third holes 194H2.

A second conductive material layer 144P filling the second holes 194H1 and the third holes 194H2 and covering the first upper rear cover layer 194 is formed. The second conductive material layer 144P may include a material containing Cu.

Figure 3F:
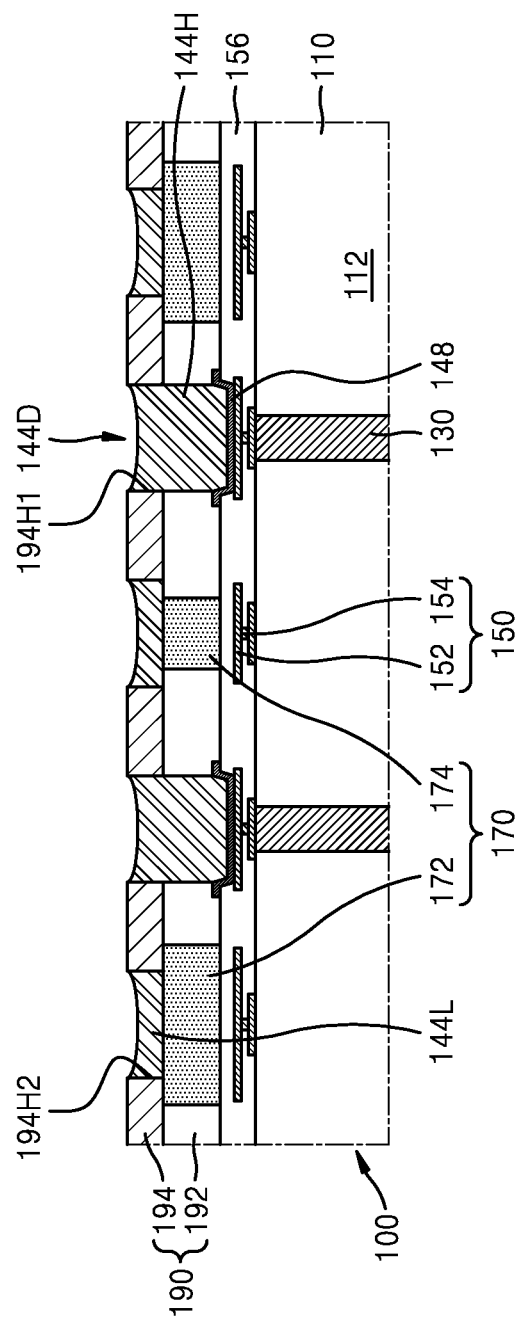

Referring to FIGS. 3E and 3F together, by performing a damascene process of removing a portion of the second conductive material layer 144P until the upper surface of the first upper rear cover layer 194 is exposed, the first semiconductor chip 100 having a plurality of first thick rear connection pads 144H that fill the second holes 194H1 and a plurality of first thin rear connection pads 144L that fill the third holes 194H2 is formed.

In some embodiments, in the process of forming the first thick rear connection pads 144H and the first thin rear connection pads 144L, a dishing phenomenon occurs in which the second conductive material layer 144P is removed greater than the upper surface of the first upper rear cover layer 194, and thus, a first dishing portion 144D may be formed in the upper surfaces of the first thick rear connection pads 144H and the first thin rear connection pads 144L. In some embodiments, the lowest portion of the first thick rear connection pads 144H and the first thin rear connection pads 144L may be about 40 Å to about 80 Å lower than the upper surface of the first upper rear cover layer 194. The first dishing portion 144D of the first thick rear connection pads 144H and the first dishing portion 144D of the first thin rear connection pads 144L may have substantially the same shape, for example, the same width and the same depth.

Figure 3G:
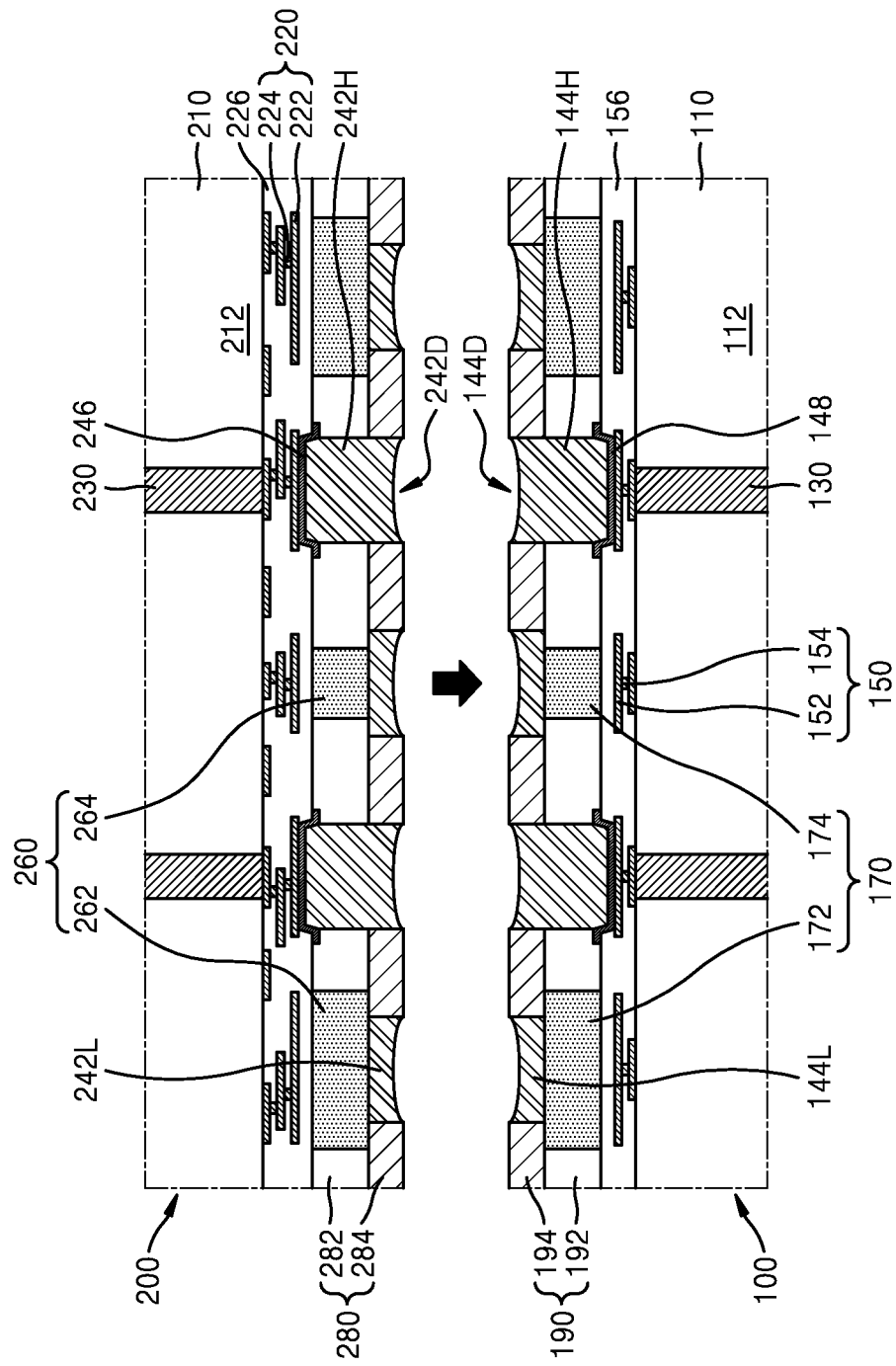

Referring to FIG. 3G, the second semiconductor chips 200 are prepared by referring to the manufacturing method described with reference to FIGS. 3A to 3F. The second semiconductor chips 200 may include the front cover layer 280 including the lower front cover layer 282 covering the second front wiring structure 220, and the upper front cover layer 284 covering the lower front cover layer 282, the front dummy conductive layer 260 penetrating the lower front cover layer 282 and including at least one front wide dummy pattern 262 and the front narrow dummy pattern 264, and a plurality of thick front connection pads 242H and a plurality of thin front connection pads 242L both penetrating the front cover layer 280 and connected to the front UBM layer 246. Similar to the first dishing portion 144D of the first thick rear connection pads 144H and the first thin rear connection pads 144L, the thick front connection pads 242H and the thin front connection pads 242L may each have a second dishing portion 242D.

Thereafter, the second semiconductor chip 200 is attached on the first semiconductor chip 100 such that the first upper rear cover layer 194 and the upper front cover layer 284 are in contact with each other, the first thick rear connection pads 144H and the thick front connection pads 242H correspond to each other, and the first thin rear connection pads 144L and the thin front connection pads 242L correspond to each other.

By applying heat and/or pressure in the process of attaching the second semiconductor chips 200 on the first semiconductor chip 100, the first upper rear cover layer 194 and the upper front cover layer 284 may be bonded to each other. In some embodiments, the first upper rear cover layer 194 and the upper front cover layer 284 may bonded to each other forming a covalent bond. In some embodiments, the first upper rear cover layer 194 and the upper front cover layer 284 may integrally form the first bonding cover layer BI1. For example, heat of a first temperature may be applied in the process of attaching the second semiconductor chips 200 on the first semiconductor chip 100.

Thereafter, by applying heat of a second temperature that is higher than the first temperature, the first bonded pads BP1 are formed which are obtained by bonding the first thick rear connection pads 144H and the thick front connection pads 242H corresponding to each other, and the first dummy bonded pads DBP1 are formed which are obtained by bonding the first thin rear connection pads 144L and the thin front connection pads 242L corresponding to each other. The first thick rear connection pads 144H and the thick front connection pads 242H corresponding to each other, and the first thin rear connection pads 144L and the thin front connection pads 242L corresponding to each other, are thermally expanded to be in contact with each other, and then, through diffusion of metal atoms included therein, the first bonded pads BP1 and the first dummy bonded pads DBP1 are diffusion bonded to each other forming one body.

The first thick rear connection pads 144H may correspond to the first lower pad portion BP1L of each of the first bonded pads BP1, and the thick front connection pads 242H may correspond to the first upper pad portion BP1H of each of the first bonded pads BP1. The first thin rear connection pads 144L may correspond to the first lower dummy pad portion DBP1L of each of the first dummy bonded pads DBP1, and the thin front connection pads 242L may correspond to the first upper dummy pad portion DBP1H of each of the first dummy bonded pads DBP1.

The front UBM layer 246, the front cover layer 280, the front dummy conductive layer 260, the thick front connection pads 242H, and the thin front connection pads 242L, which are disposed on the active surface of the second semiconductor substrate 210, may each be formed by a method similar to the first rear UBM layer 148, the first rear cover layer 190, the first rear dummy conductive layer 170, the first thick rear connection pads 144H, and the first thin rear connection pads 144L, respectively, which are disposed on the inactive surface of the first semiconductor substrate 110.

Furthermore, the second rear wiring structure 250, the second rear UBM layer 248, the second rear cover layer 290, and the second rear dummy conductive layer 270, which are illustrated in FIG. 2C, may be formed by a method similar to the first rear wiring structure 150, the first rear UBM layer 148, the first rear cover layer 190, the first rear dummy conductive layer 170, respectively, which are disposed on the inactive surface of the first semiconductor substrate 110, and the second bonded pads BP2 and the second dummy bonded pads DBP2 may be formed by a method similar to the first bonded pads BP1 and the first dummy bonded pads DBP1, thereby forming the semiconductor package 1000 illustrated in FIGS. 1 to 2D.

Referring to FIGS. 1 to 3G together, the first rear wide dummy pattern 172 and the first rear narrow dummy pattern 174 having different horizontal widths may be connected to the first thin rear connection pads 144L, and the front wide dummy pattern 262 and the front narrow dummy pattern 264 having different horizontal widths may be connected to the thin front connection pads 242L.

The first thin rear connection pads 144L and the first thick rear connection pads 144H may have the same first horizontal width W1, and may be arranged at the same pitch PT. The thin front connection pads 242L and the thick front connection pads 242H may have the same first horizontal width W1, and may be arranged at the same pitch PT. The first thin rear connection pads 144L and the first thick rear connection pads 144H may each include the first dishing portion 144D having substantially the same shape, and the thin front connection pads 242L and the thick front connection pads 242H may each include the second dishing portion 242D having substantially the same shape.

Accordingly, in the process of forming the first bonded pads BP1 by bonding the first thick rear connection pads 144H and the thick front connection pads 242H corresponding to each other, and in the process of forming the first dummy bonded pads DBP1 by bonding the first thin rear connection pads 144L and the thin front connection pads 242L, voids may be prevented from being generated in the first bonded pads BP1 and the first dummy bonded pads DBP1, and likewise, voids may be prevented from being generated in the second bonded pads BP2 and the second dummy bonded pads DBP2. Accordingly, the reliability of the semiconductor package 1000 may be improved.

Figure 4A:
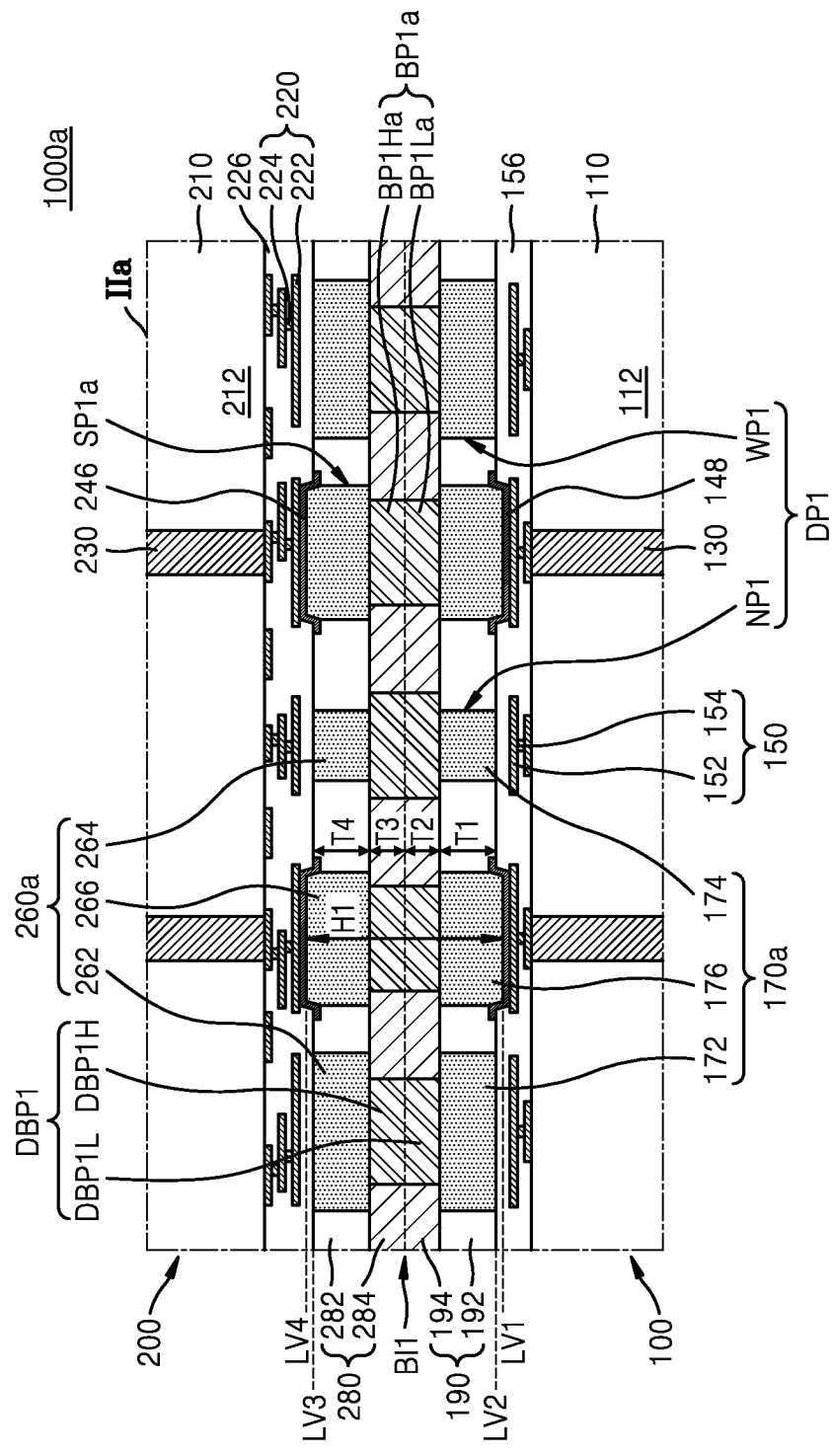
FIGS. 4A to 4D are enlarged cross-sectional views of a semiconductor package according to an embodiment.
Figure 4B:
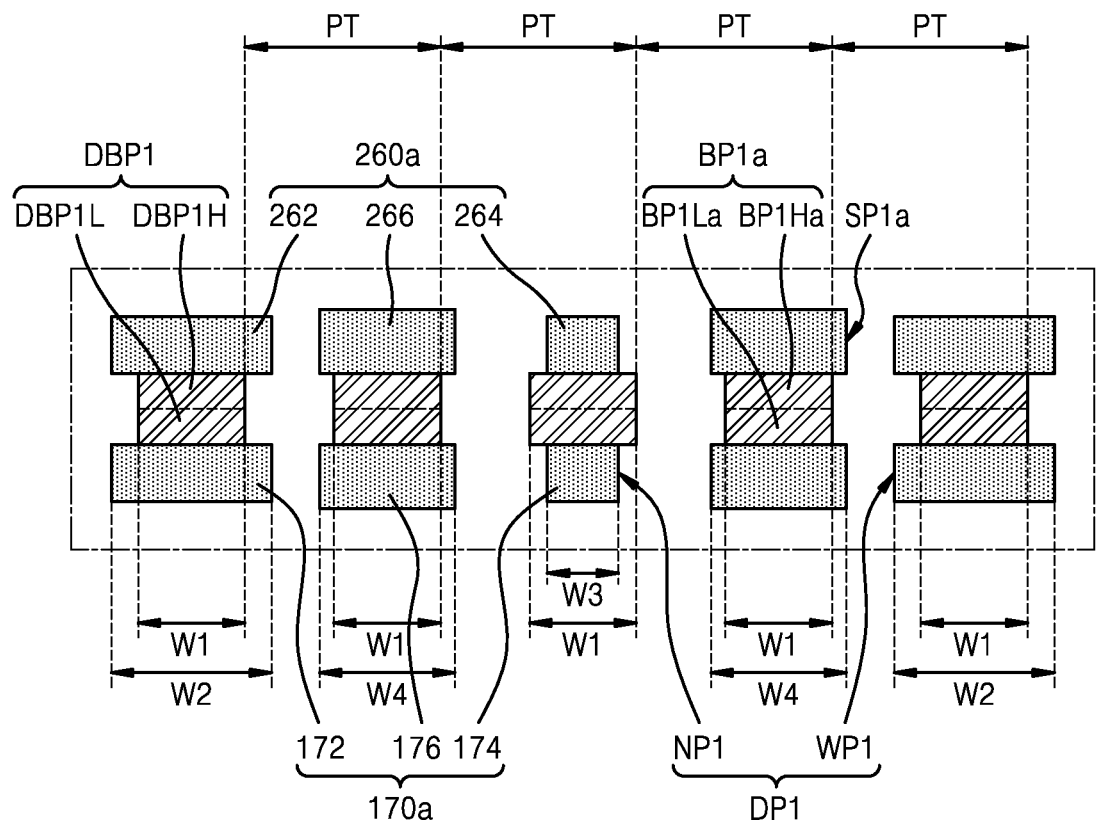
Figure 4C:
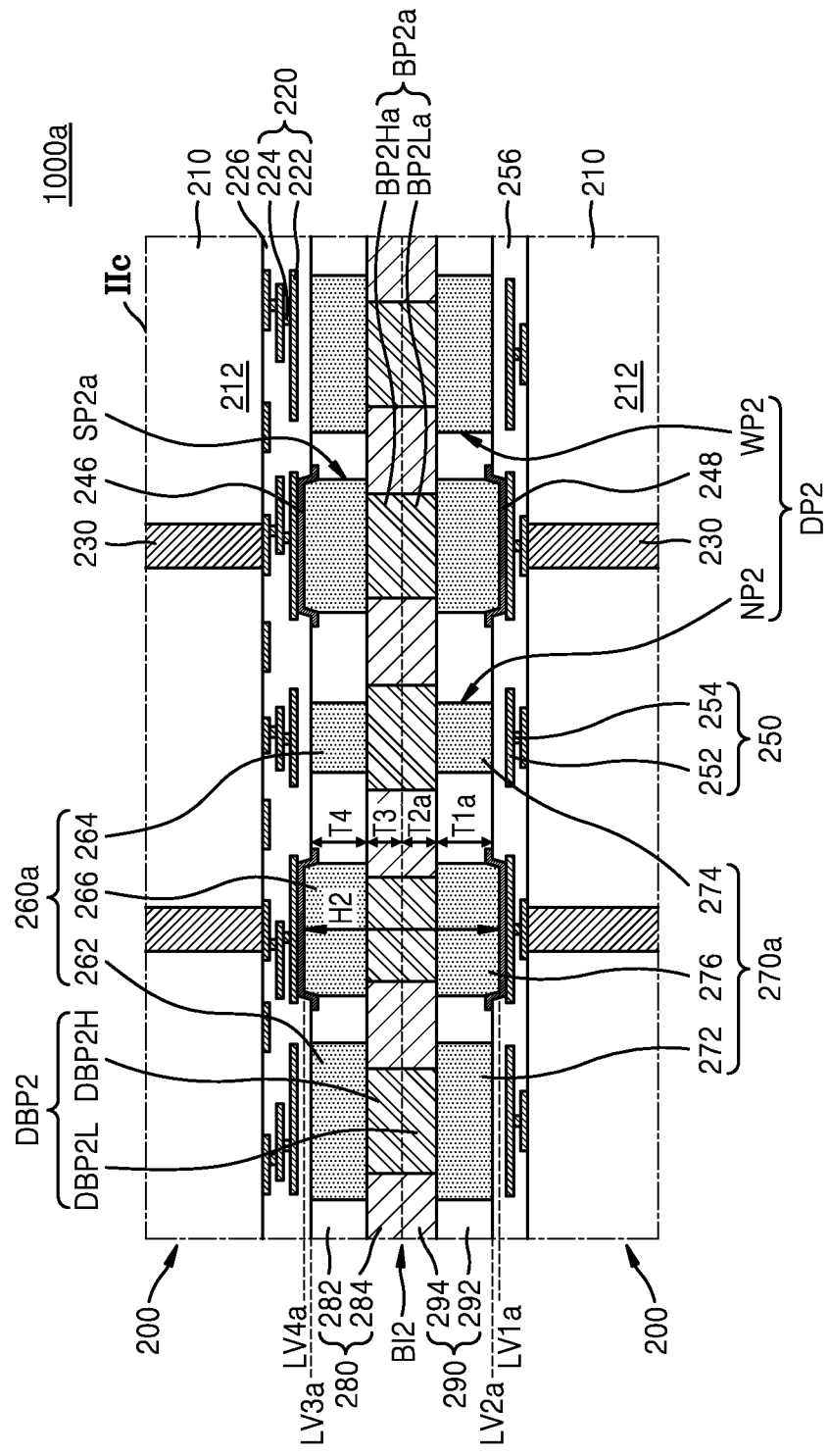
Figure 4D:
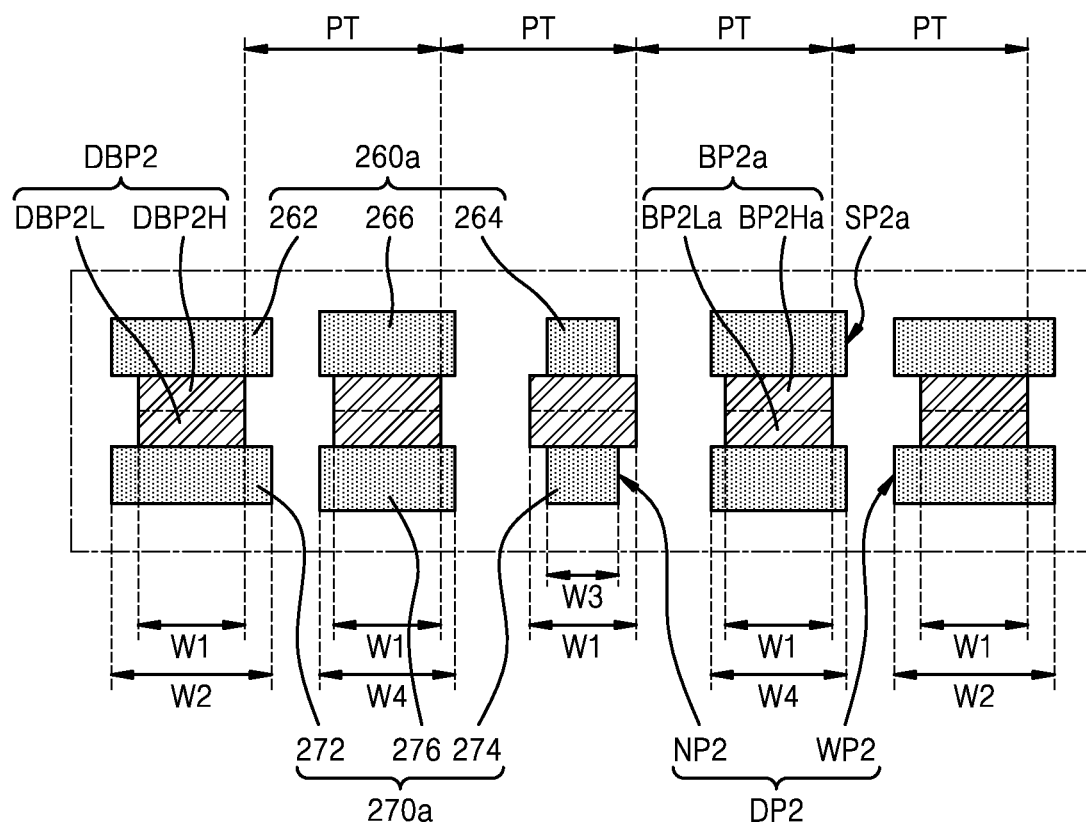

FIGS. 4A to 4D are enlarged cross-sectional views of a semiconductor package 1000a according to an embodiment. In detail, FIG. 4A is an enlarged cross-sectional view of a portion corresponding to the region IIa of FIG. 1, FIG. 4B is an enlarged cross-sectional view of only some elements of FIG. 4A, FIG. 4C is an enlarged cross-sectional view of a portion corresponding to the region IIc of FIG. 1, and FIG. 4D is an enlarged cross-sectional view of only some elements of FIG. 4C.

Referring to FIGS. 4A to 4D, the semiconductor package 1000a may include the first semiconductor chip 100 and the second semiconductor chips 200. Instead of the first rear dummy conductive layer 170, the front dummy conductive layer 260, the second rear dummy conductive layer 270, the first bonded pads BP1, and the second bonded pads BP2, which are included in the semiconductor package 1000 of FIGS. 1 to 2D, the semiconductor package 1000a illustrated in FIGS. 4A to 4D may include a first rear dummy conductive layer 170a, a front dummy conductive layer 260a, a second rear dummy conductive layer 270a, a plurality of first bonded pads BP1a, and a plurality of second bonded pads BP2a.

The first rear dummy conductive layer 170a may be disposed in the first lower rear cover layer 192, the front dummy conductive layer 260a may be disposed in the lower front cover layer 282, and the second rear dummy conductive layer 270a may be disposed in the second lower rear cover layer 292. The first rear dummy conductive layer 170a, the front dummy conductive layer 260a, and the second rear dummy conductive layer 270a may be formed to penetrate the first lower rear cover layer 192, the lower front cover layer 282, and the second lower rear cover layer 292, respectively.

The first rear dummy conductive layer 170a may include the first rear wide dummy pattern 172, the first rear narrow dummy pattern 174, and a first rear signal pattern 176. The front dummy conductive layer 260a may include the front wide dummy pattern 262, the front narrow dummy pattern 264, and a front signal pattern 266. The second rear dummy conductive layer 270a may include the second rear wide dummy pattern 272, the second rear narrow dummy pattern 274, and a second rear signal pattern 276.

The first rear signal pattern 176 and the front signal pattern 266 opposite to each other may overlap in the vertical direction, and the second rear signal pattern 276 and the front signal pattern 266 opposite to each other may overlap in the vertical direction. The first rear signal pattern 176 and the front signal pattern 266 opposite to each other may have the same horizontal width, and the second rear signal pattern 276 and the front signal pattern 266 opposite to each other may have the same horizontal width.

The first bonded pads BP1a may be disposed in the first upper rear cover layer 194 and the upper front cover layer 284 in contact with each other, that is, in the first bonding cover layer BI1. The second bonded pads BP2a may be disposed in the second upper rear cover layer 294 and the upper front cover layer 284 in contact with each other, that is, in the second bonding cover layer BI2.

The first bonded pads BP1a may be formed to penetrate the first bonding cover layer BI1, and the second bonded pads BP2a may be formed to penetrate the second bonding cover layer BI2. In some embodiments, the upper surfaces and the lower surfaces of the first bonded pads BP1a are located at the same vertical levels of the upper surface and the lower surface of the first bonding cover layer BI1, to be coplanar, and the upper surfaces and the lower surfaces of the second bonded pads BP2a are located at the same vertical levels of the upper surface and the lower surface of the second bonding cover layer BI2, to be coplanar.

The first bonded pads BP1a and the first dummy bonded pads DBP1 may be arranged between the first rear dummy conductive layer 170a and the front dummy conductive layer 260a, and the second bonded pads BP2a and the second dummy bonded pads DBP2 may be arranged between the second rear dummy conductive layer 270a and the front dummy conductive layer 260a. For example, the first bonded pads BP1a may be arranged between the first rear signal pattern 176 and the front signal pattern 266, and the second bonded pads BP2a may be arranged between the second rear signal pattern 276 and the front signal pattern 266.

The first rear signal pattern 176, the first bonded pads BP1a, and the front signal pattern 266, which are connected to one another, may form a first signal pad structure SP1a, and the second rear signal pattern 276, the second bonded pads BP2a, and the front signal pattern 266, which are connected to one another, may form a second signal pad structure SP2a.

A portion of each of the first bonded pads BP1a penetrating the first upper rear cover layer 194 may be referred to as a first lower pad portion BP1La, and another portion thereof penetrating the upper front cover layer 284 may be referred to as a first upper pad portion BP1Ha. The first lower pad portion BP1La and the first upper pad portion BP1Ha corresponding to each other may form one body. A portion of each of the second bonded pads BP2a penetrating the second upper rear cover layer 294 may be referred to as a second lower pad portion BP2La, and another portion thereof penetrating the upper front cover layer 284 may be referred to as a second upper pad portion BP2Ha. The second lower pad portion BP2La and the second upper pad portion BP2Ha corresponding to each other may form one body.

The first bonded pads BP1a, the second bonded pads BP2a, the first dummy bonded pads DBP1, and the second dummy bonded pads DBP2 may each have the same first horizontal width W1.

The first rear signal pattern 176, the front signal pattern 266, and the second rear signal pattern 276 may each have a fourth horizontal width W4 that is greater than the first horizontal width W1. The fourth horizontal width W4 may be less than the second horizontal width W2.

The first bonded pads BP1a, and the first dummy bonded pads DBP1 arranged between the first semiconductor chip 100 and the second semiconductor chip 200 at the bottom of the second semiconductor chips 200 may be arranged at the same pitch PT. The second bonded pads BP2a and the second dummy bonded pads DBP2 located between the two second semiconductor chips 200 adjacent to each other in the vertical direction may be arranged at the same pitch PT.

FIGS. 5A to 5D are cross-sectional views showing, step by step, a method of manufacturing a semiconductor package, according to an embodiment.

Figure 5A:
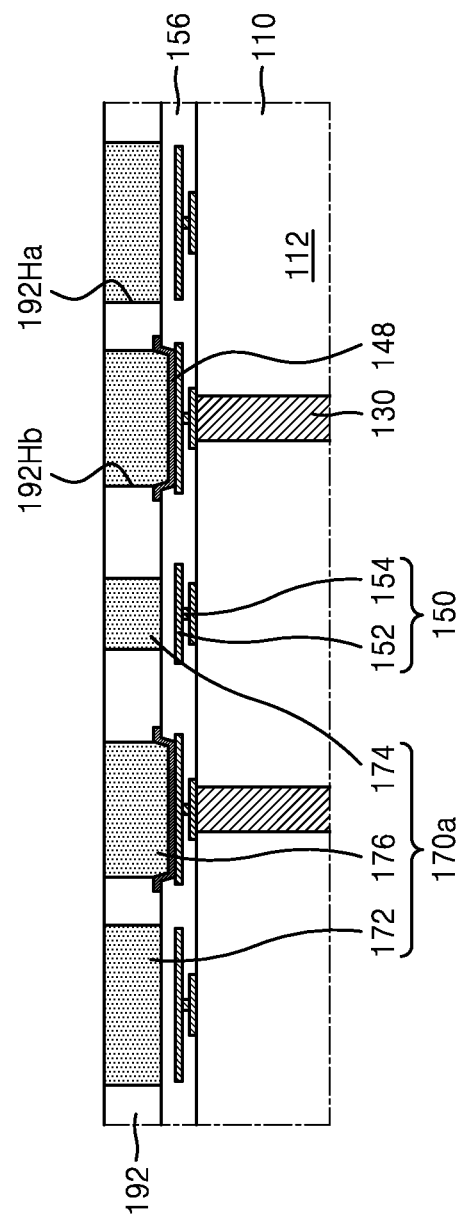
FIGS. 5A to 5D are cross-sectional views showing a method of manufacturing a semiconductor package, according to an embodiment.

Referring to FIG. 5A, by removing a portion of the first lower rear cover layer 192 illustrated in FIG. 3B, a plurality of first holes 192Ha are formed such that the first rear inter-wiring insulating layer 156 is exposed through each lower surface thereof, and a plurality of second holes 192Hb are formed such that the first rear UBM layer 148 is exposed through each lower surface thereof, and then, the first rear dummy conductive layer 170a filling the first holes 192Ha and the second holes 192Hb is formed. The first rear dummy conductive layer 170a may include the first rear wide dummy pattern 172 and the first rear narrow dummy pattern 174, both filling the first holes 192Ha, and the first rear signal pattern 176 filling the second holes 192Hb. The first rear dummy conductive layer 170a may include a material containing Cu or a material containing Al.

Figure 5B:
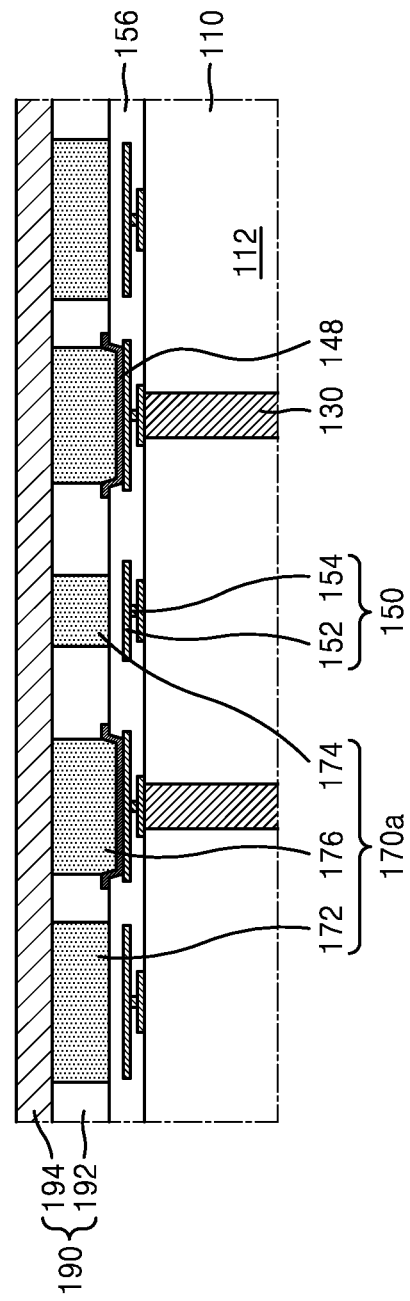

Referring to FIG. 5B, the first lower rear cover layer 192 and the first upper rear cover layer 194 covering the first rear dummy conductive layer 170a are formed.

Figure 5C:
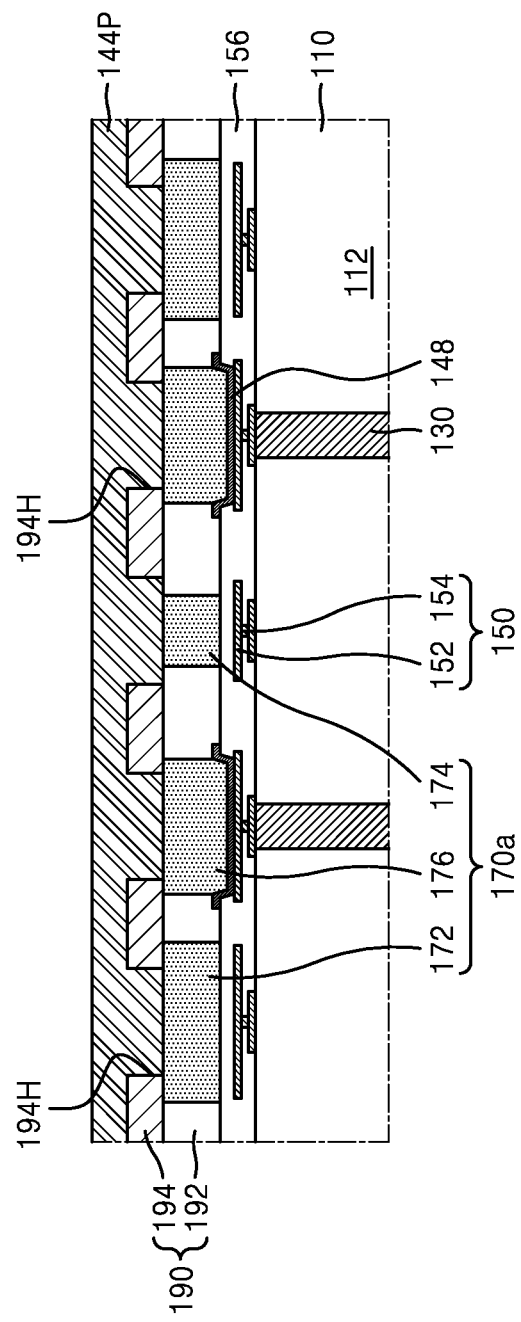

Referring to FIG. 5C, by removing portions of the first upper rear cover layer 194, a plurality of third holes 194H are formed such that the first rear dummy conductive layer 170a is exposed through each lower surface thereof.

The second conductive material layer 144P filling the third holes 194H and covering the first upper rear cover layer 194 is formed.

Figure 5D:
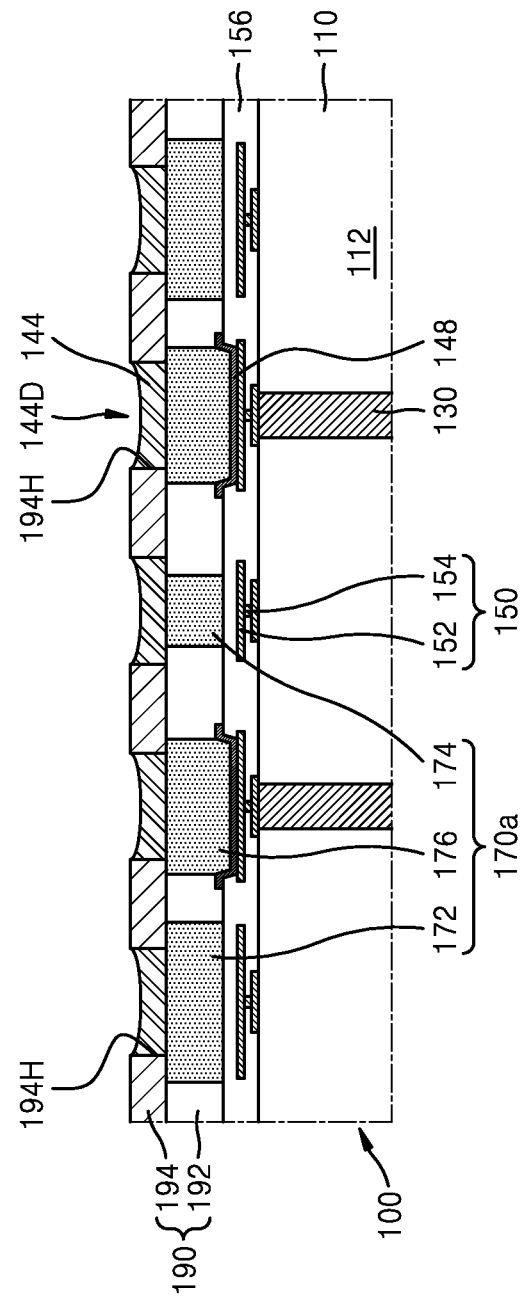

Referring to FIGS. 5C and 5D together, by performing a damascene process of removing a portion of the second conductive material layer 144P until the upper surface of the first upper rear cover layer 194 is exposed, the first semiconductor chip 100 including a plurality of first rear connection pads 144 filling the third holes 194H is formed. In some embodiments, in the process of forming the first rear connection pads 144, a dishing phenomenon occurs in which the second conductive material layer 144P is removed to a depth greater than the upper surface of the first upper rear cover layer 194, and thus, the first dishing portion 144D may be formed on the upper surface of the first rear connection pads 144.

Each of the first rear connection pads 144 may be disposed on any one of the first rear wide dummy pattern 172, the first rear narrow dummy pattern 174, and the first rear signal pattern 176.

Thereafter, with reference to the manufacturing method described in FIG. 3G, a plurality of second semiconductor chips each including a plurality of front connection pads similar to the first rear connection pads 144 and a plurality of second rear connection pads are prepared, and the second semiconductor chip 200 is attached on the first semiconductor chip 100 such that the first rear connection pads 144 correspond to the front connection pads and the second rear connection pads correspond to the front connection pads, and thus, the semiconductor package 1000a including the first bonded pads BP1a and the second bonded pads BP2a illustrated in FIGS. 4A to 4D may be formed.

Figure 6A:
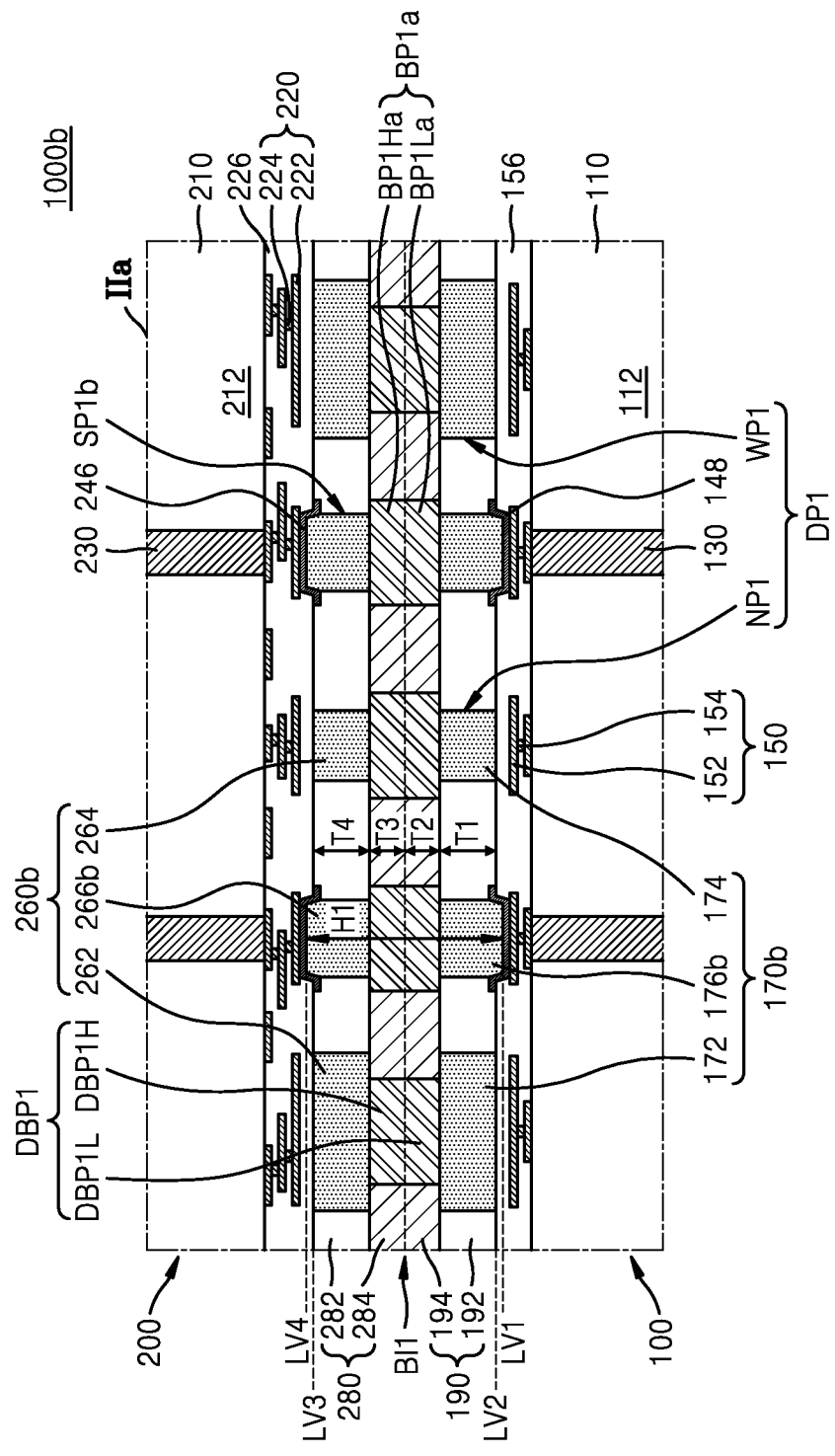
FIGS. 6A to 6D are enlarged cross-sectional views of a semiconductor package according to an embodiment.
Figure 6B:
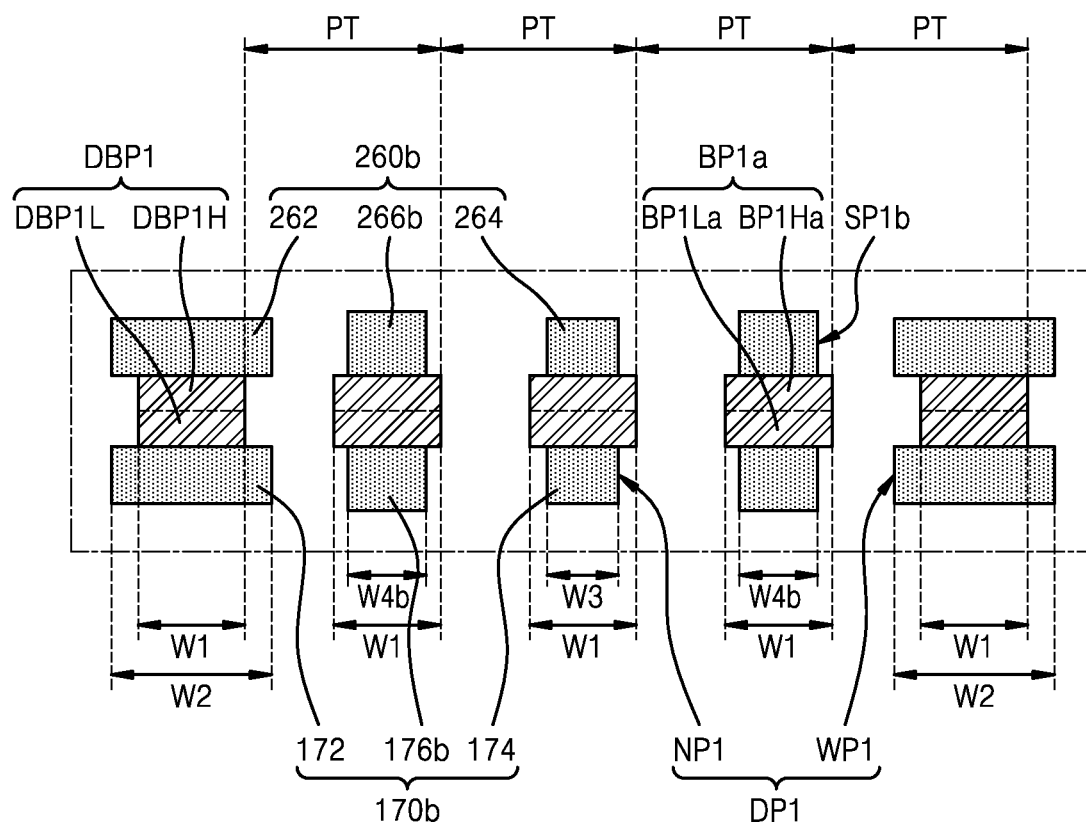
Figure 6C:
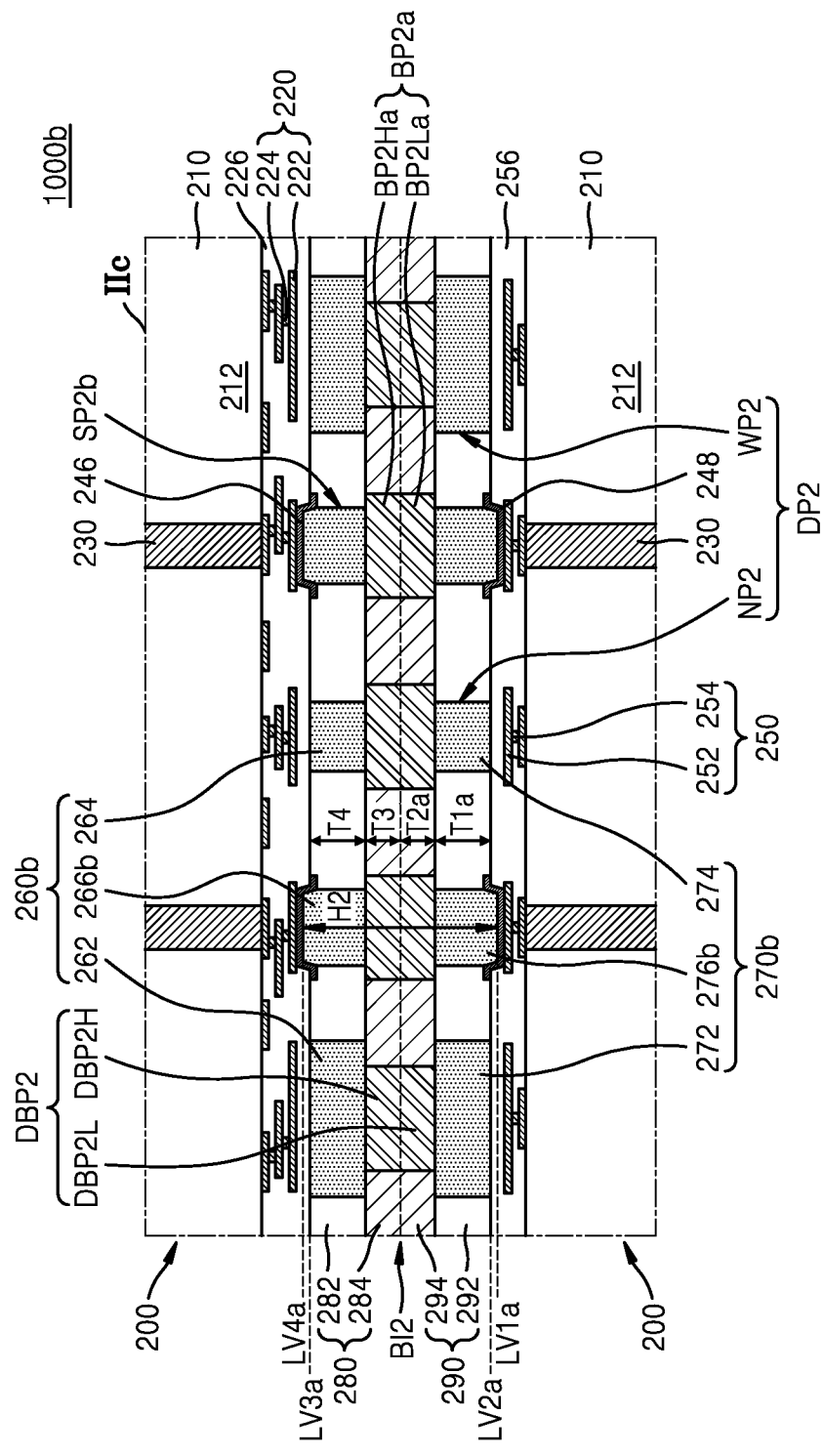
Figure 6D:
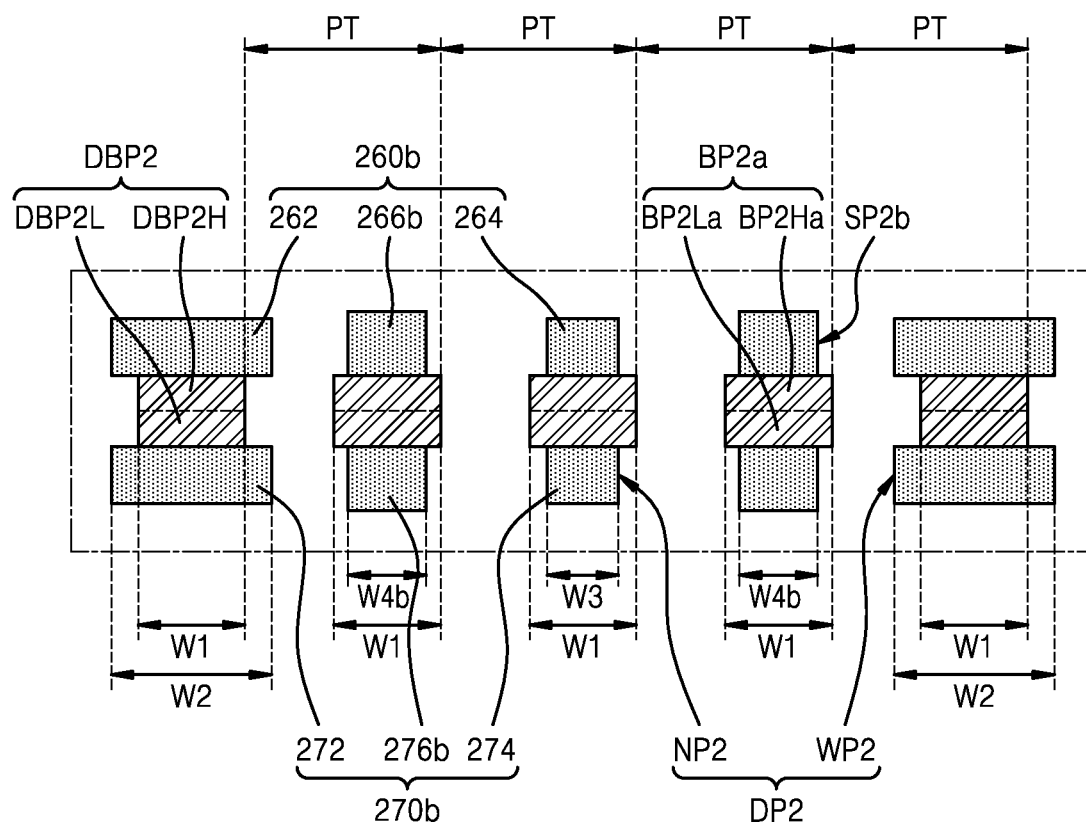

FIGS. 6A to 6D are enlarged cross-sectional views of a semiconductor package 1000b according to an embodiment. In detail, FIG. 6A is an enlarged cross-sectional view of a portion corresponding to the region IIa of FIG. 1, FIG. 6B is an enlarged cross-sectional view of only some elements of FIG. 6A, FIG. 6C is an enlarged cross-sectional view of a portion corresponding to the region IIc of FIG. 1, and FIG. 6D is an enlarged cross-sectional view of only some elements of FIG. 6C.

Referring to FIGS. 6A to 6D together, the semiconductor package 1000b may include the first semiconductor chip 100 and the second semiconductor chips 200. Instead of the first rear dummy conductive layer 170, the front dummy conductive layer 260, the second rear dummy conductive layer 270, the first bonded pads BP1, and the second bonded pads BP2, which are included in the semiconductor package 1000 illustrated in FIGS. 1 to 2D, the semiconductor package 1000b illustrated in FIGS. 6A to 6D may include a first rear dummy conductive layer 170b, a front dummy conductive layer 260b, a second rear dummy conductive layer 270b, a plurality of first bonded pads BP1a, and a plurality of second bonded pads BP2a.

The first rear dummy conductive layer 170b may be disposed in the first lower rear cover layer 192, the front dummy conductive layer 260b may be disposed in the lower front cover layer 282, and the second rear dummy conductive layer 270b may be disposed in the second lower rear cover layer 292. The first rear dummy conductive layer 170b, the front dummy conductive layer 260b, and the second rear dummy conductive layer 270b may each be formed to penetrate the first lower rear cover layer 192, the lower front cover layer 282, and the second lower rear cover layer 292, respectively.

The first rear dummy conductive layer 170b may include the first rear wide dummy pattern 172, the first rear narrow dummy pattern 174, and a first rear signal pattern 176b. The front dummy conductive layer 260b may include the front wide dummy pattern 262, the front narrow dummy pattern 264, and a front signal pattern 266b. The second rear dummy conductive layer 270b may include the second rear wide dummy pattern 272, the second rear narrow dummy pattern 274, and a second rear signal pattern 276b.

The first rear signal pattern 176b and the front signal pattern 266b opposite to each other may overlap each other in the vertical direction, and the second rear signal pattern 276b and the front signal pattern 266b opposite to each other may overlap each other in the vertical direction. The first rear signal pattern 176b and the front signal pattern 266b opposite to each other may have the same horizontal width, and the second rear signal pattern 276b and the front signal pattern 266b opposite to each other may have the same horizontal width.

The first bonded pads BP1a may be disposed in the first upper rear cover layer 194 and the upper front cover layer 284 in contact with each other, that is, in the first bonding cover layer BI1, and the second bonded pads BP2a may be disposed in the second upper rear cover layer 294 and the upper front cover layer 284 in contact with each other, that is, in the second bonding cover layer BI2.

The first bonded pads BP1a and the first dummy bonded pads DBP1 may be arranged between the first rear dummy conductive layer 170b and the front dummy conductive layer 260b, and the second bonded pads BP2a and the second dummy bonded pads DBP2 may be arranged between the second rear dummy conductive layer 270b and the front dummy conductive layer 260b. For example, the first bonded pads BP1a may be arranged between the first rear signal pattern 176b and the front signal pattern 266b, and the second bonded pads BP2a may be arranged between the second rear signal pattern 276b and the front signal pattern 266b.

The first rear signal pattern 176b, the first bonded pad BP1a, and the front signal pattern 266b, which are connected to one another, may form a first signal pad structure SP1b. The second rear signal pattern 276b, the second bonded pad BP2a, and the front signal pattern 266b, which are connected to one another, may form the second signal pad structure SP2a.

The first bonded pad BP1a, the second bonded pad BP2a, the first dummy bonded pads DBP1, and the second dummy bonded pads DBP2 may each have the same first horizontal width W1.

The first rear signal pattern 176b, the front signal pattern 266b, and the second rear signal pattern 276b may each have a fourth horizontal width W4b that is less than the first horizontal width W1. The fourth horizontal width W4b may be greater than a third horizontal width W3.

Figure 7:
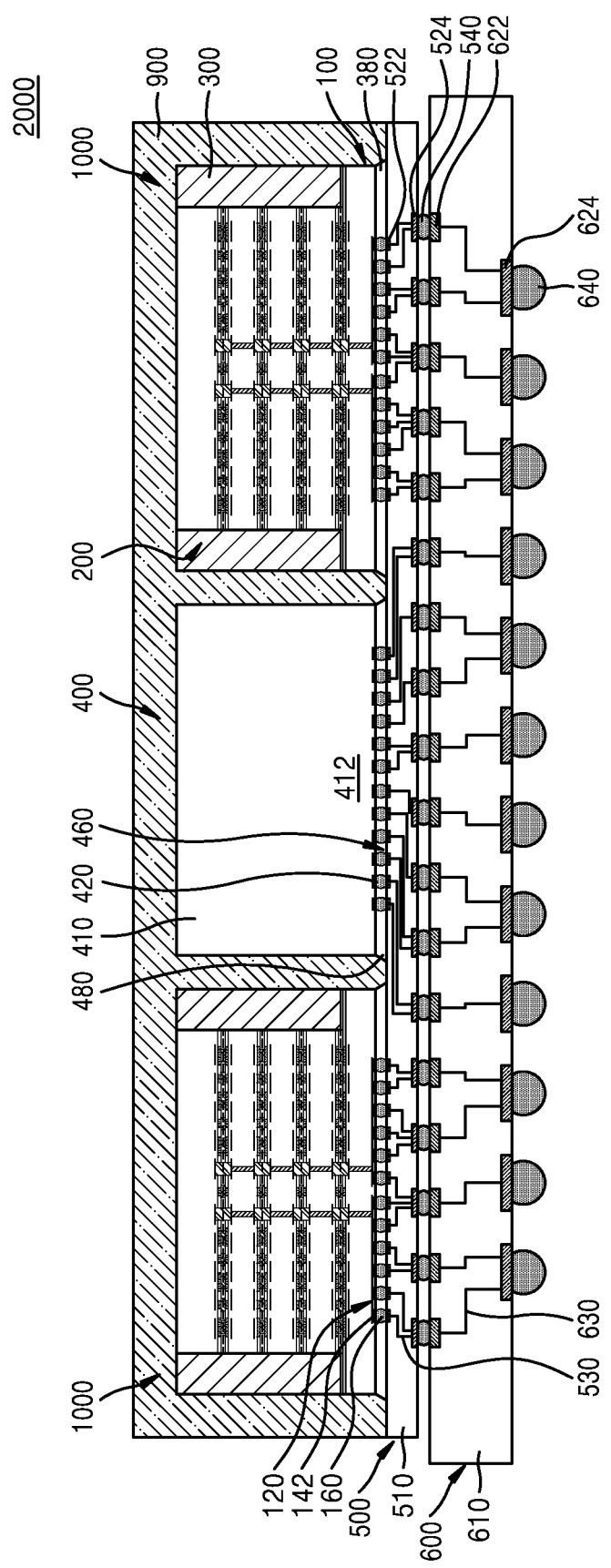
FIG. 7 is a cross-sectional view of a semiconductor package according to an embodiment.

FIG. 7 is a cross-sectional view of a semiconductor package 2000 according to an embodiment.

Referring to FIG. 7, the semiconductor package 2000 may include a main board 600 on which an interposer 500 is mounted, at least one sub-semiconductor package 1000 attached to the interposer 500 and including the first semiconductor chip 100 and the second semiconductor chips 200, and a third semiconductor chip 400. The sub-semiconductor package 1000 may be any one of the semiconductor package 1000 illustrated in FIGS. 1 to 2D, the semiconductor package 1000a illustrated in FIG. 4A to 4D, or the semiconductor package 1000b illustrated in FIGS. 6A to 6D. Furthermore, the semiconductor package 2000 may be referred to as a system.

The sub-semiconductor package 1000 may be attached to the interposer 500 by means of a plurality of first connection bumps 160. The first connection bumps 160 are attached to the first front pads 142 and may be electrically connected to the first front wiring structure 120 of the first semiconductor chip 100. The first connection bumps 160 may provide at least one of a signal, power, and ground for the sub-semiconductor package 1000.

Although FIG. 7 illustrates that the semiconductor package 2000 includes two sub-semiconductor packages 1000, embodiments of the disclosure are not limited thereto. For example, the semiconductor package 2000 may include one sub-semiconductor package 1000 or three or more sub-semiconductor packages 1000.

The third semiconductor chip 400 may include a third semiconductor substrate 410 in which a third semiconductor device 412 is formed in an active surface thereof, and a plurality of upper surface connection pads 420. In some embodiments, the upper surface connection pads 420 may each include at least one of aluminum, copper, and nickel. The third semiconductor chip 400 may be attached to the interposer 500 by means of a plurality of second connection bumps 460. The second connection bumps 460 may be attached to the upper surface connection pads 420. The third semiconductor chip 400 may include, for example, a CPU chip, a GPU chip, or an AP chip.

As the third semiconductor substrate 410 is a constituent element substantially similar to the first semiconductor substrate 110 or the second semiconductor substrate 210 illustrated in FIG. 1, the third semiconductor device 412 is a constituent element substantially similar to the first semiconductor device 112 or the second semiconductor device 212 illustrated in FIG. 1, and the second connection bumps 460 are constituent elements substantially similar to the first connection bumps 160, detailed descriptions thereof are omitted.

The interposer 500 may include a base layer 510, a plurality of first upper surface pads 522 and a plurality of first lower surface pads 524, which are respectively disposed on an upper surface and a lower surface of the base layer 510, and a plurality of first wiring paths 530 for electrically connecting the first upper surface pads 522 with the first lower surface pads 524 through the base layer 510. The base layer 510 may include a semiconductor, glass, ceramic, or plastic. For example, the base layer 510 may include silicon. The first wiring paths 530 may be wiring layers that are connected to the first upper surface pads 522 and/or the first lower surface pads 524 in the upper surface and/or lower surface of the base layer 510, and/or internal through electrodes that electrically connect the first upper surface pads 522 with the first lower surface pads 524 in the base layer 510. The first connection bumps 160 that electrically connect the sub-semiconductor package 1000 with the interposer 500 and the second connection bumps 460 that electrically connect the third semiconductor chip 400 with the interposer 500 may be connected to each other on the first upper surface pads 522.

A first underfill layer 380 may be arranged between the sub-semiconductor package 1000 and the interposer 500, and a second underfill layer 480 may be arranged between the third semiconductor chip 400 and the interposer 500. The first underfill layer 380 and the second underfill layer 480 may surround the first connection bumps 160 and the second connection bumps 460, respectively.

The semiconductor package 2000 may further include a package molding layer 900 that surrounds side surfaces of the sub-semiconductor package 1000 and the third semiconductor chip 400 on the interposer 500. The package molding layer 900 may include, for example, epoxy mold compound (EMC). In some embodiments, the package molding layer 900 may cover the upper surfaces of the sub-semiconductor package 1000 and the third semiconductor chip 400. In some embodiments, the package molding layer 900 may not cover the upper surfaces of the sub-semiconductor package 1000 and the third semiconductor chip 400. For example, a heat dissipation member may be attached on the sub-semiconductor package 1000 and the third semiconductor chip 400 with a thermal interface material (TIM) layer therebetween.

A plurality of board connection terminals 540 may be attached on the first lower surface pads 524. The board connection terminals 540 may electrically connect the interposer 500 with the main board 600.

The main board 600 may include a base board layer 610, a plurality of second upper surface pads 622 and a plurality of second lower surface pads 624 which are respectively disposed on an upper surface and a lower surface of the base board layer 610, and a plurality of second wiring paths 630 that electrically connect the second upper surface pads 622 with the second lower surface pads 624 through the base board layer 610.

In some embodiments, the main board 600 may be a printed circuit board. For example, the main board 600 may be a multi-layer printed circuit board. The base board layer 610 may include at least one material selected from among phenol resin, epoxy resin, and polyimide.

A solder resist layer for exposing the second upper surface pads 622 and the second lower surface pads 624 may be formed on each of an upper surface and a lower surface of the base board layer 610. The board connection terminals 540 may be connected to the second upper surface pads 622, and a plurality of external connection terminals 640 may be connected to the second lower surface pads 624. The board connection terminals 540 may electrically connect the first lower surface pads 524 with the second upper surface pads 622. The external connection terminals 640 connected to the second lower surface pads 624 may connect the semiconductor package 2000 to the outside.

In some embodiments, the semiconductor package 2000 does not include the main board 600, and the board connection terminals 540 of the interposer 500 may perform the function of the external connection terminals 640.

Figure 8:
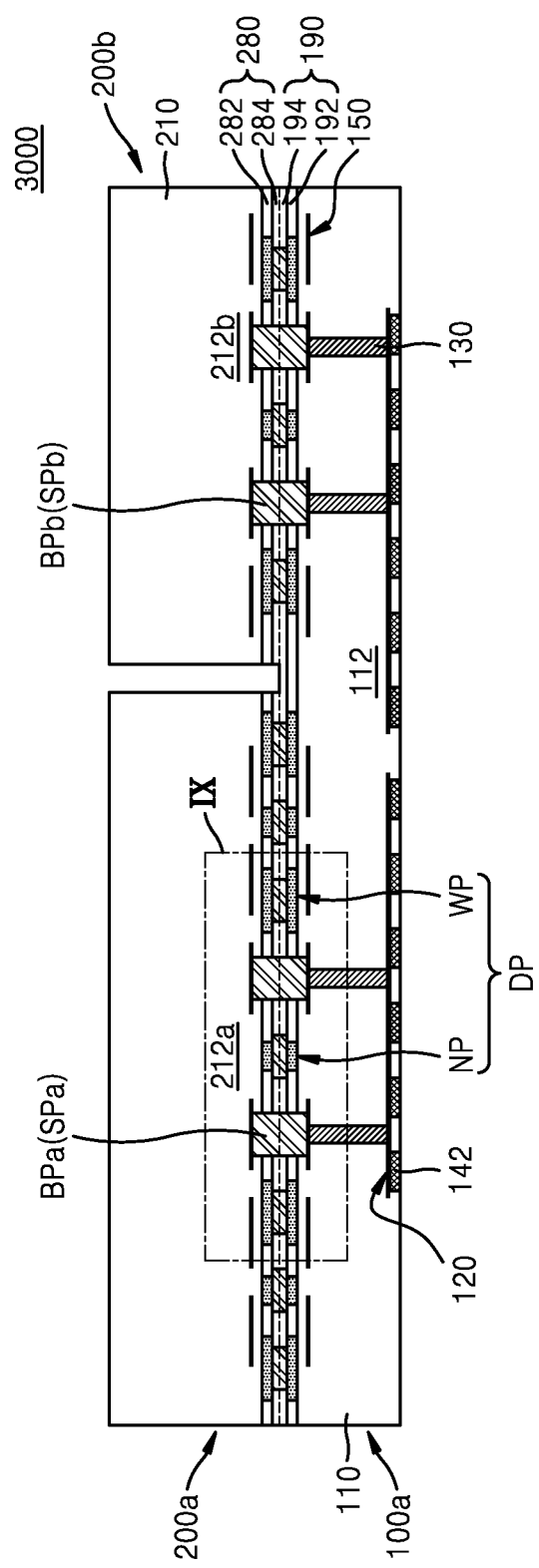
FIG. 8 is a cross-sectional view of a semiconductor package according to an embodiment.
Figure 9:
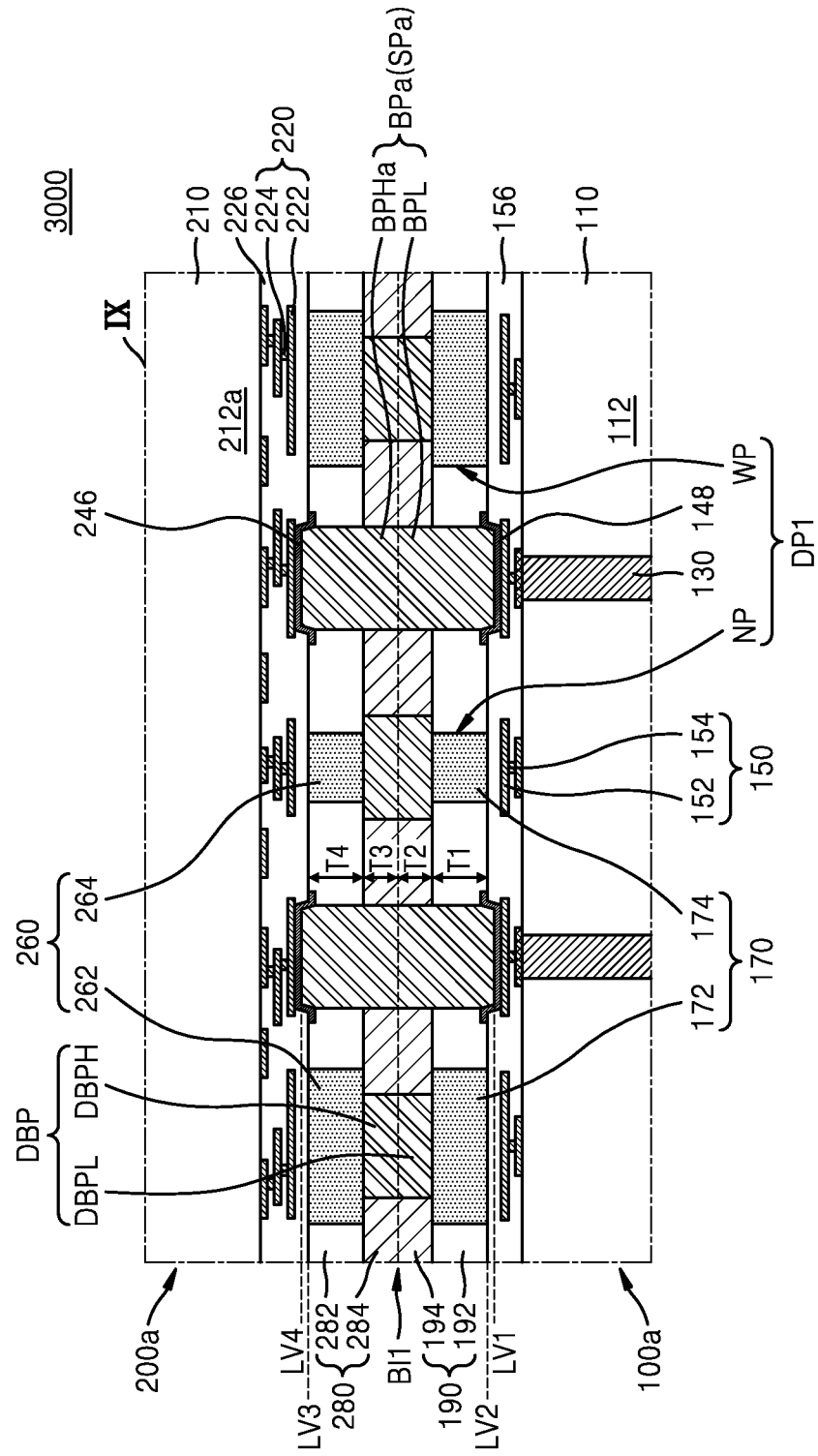
FIG. 9 is an enlarged cross-sectional view thereof.

FIG. 8 is a cross-sectional view of a semiconductor package 3000 according to an embodiment, and FIG. 9 is an enlarged cross-sectional view thereof. In detail, FIG. 9 is a cross-sectional view of a region IX of FIG. 8. In FIGS. 8 and 9, redundant descriptions with those of FIGS. 1 to 2D may be omitted.

Referring to FIGS. 8 and 9 together, the semiconductor package 3000 may include a first semiconductor chip 100*a* and a second semiconductor chip (200*a*, 200*b*). The semiconductor package 3000 may be referred to as a sub-semiconductor package. The second semiconductor chip (200*a*, 200*b*) may include a second even semiconductor chip 200*a* and a second odd semiconductor chip 200*b*. The second even semiconductor chip 200*a* and the second odd semiconductor chip 200*b* may each be attached to the first semiconductor chip 100*a*. In some embodiments, the second even semiconductor chip 200*a* and the second odd semiconductor chip 200*b* may be apart from each other in the horizontal direction and stacked on the first semiconductor chip 100*a*. In some embodiments, the second even semiconductor chip 200*a* and the second odd semiconductor chip 200*b* may be semiconductor chips of the same type. In some embodiments, the second even semiconductor chip 200*a* and the second odd semiconductor chip 200b may be semiconductor chips of different types.

Although FIG. 8 illustrates that the semiconductor package 3000 includes one first semiconductor chip as the first semiconductor chip 100a and two second semiconductor chips as the second semiconductor chip (200a, 200b), that is, the second even semiconductor chip 200a and the second odd semiconductor chip 200b, this is an example, and embodiments of the disclosure are not limited thereto. In some embodiments, the semiconductor package 3000 may include one second semiconductor chip stacked on one first semiconductor chip. In some embodiments, the semiconductor package 3000 may include three or more second semiconductor chips stacked on one first semiconductor chip. In some embodiments, the semiconductor package 3000 may include one or two or more second semiconductor chips stacked over two or more first semiconductor chips.

Except that a plurality of even bonded pads BPa and a plurality of odd bonded pads BPb respectively corresponding to the second even semiconductor chip 200a and the second odd semiconductor chip 200b are provided for two or more second semiconductor chips, for example, the second even semiconductor chip 200a and the second odd semiconductor chip 200b, to be attached on an upper surface of the first semiconductor chip 100a, the first semiconductor chip 100a illustrated in FIGS. 8 and 9 are the same as the first semiconductor chip 100 illustrated in FIGS. 1 to 2D, detailed descriptions thereof are omitted. The even bonded pads BPa may form an even signal pad structure SPa, and the odd bonded pads BPb may form an odd signal pad structure SPb.

A portion of each of the even bonded pads BPa, the portion penetrating the first rear cover layer 190 and extending into the first rear inter-wiring insulating layer 156 may be referred to as a lower pad portion BPL, and another portion thereof penetrating the front cover layer 280 of the second even semiconductor chip 200a and extending into a front inter-wiring insulating layer 226 may be referred to as an even upper pad portion BPHa. The lower pad portion BPL and the even upper pad portion BPHa corresponding to each other may form one body. Each of the odd bonded pads BPb may integrally include the lower pad portion BPL and an odd upper pad portion.

As the second even semiconductor chip 200a and the second odd semiconductor chip 200b each include a second even semiconductor device 212a and a second odd semiconductor device 212b, and each are substantially similar to or the same as the second semiconductor chip 200 at the top of the second semiconductor chips 200 illustrated in FIG. 1, which does not include the second through electrodes 230, detailed descriptions thereof are omitted. The second even semiconductor device 212a and the second odd semiconductor device 212b may be the same as or similar to the second semiconductor device 212 illustrated in FIGS. 1 to 2D.

In some embodiments, the second even semiconductor chip 200a and the second odd semiconductor chip 200b may be semiconductor chips of the same type. In some embodiments, the second even semiconductor chip 200a and the second odd semiconductor chip 200b may be semiconductor chips of different types.

Figure 10:
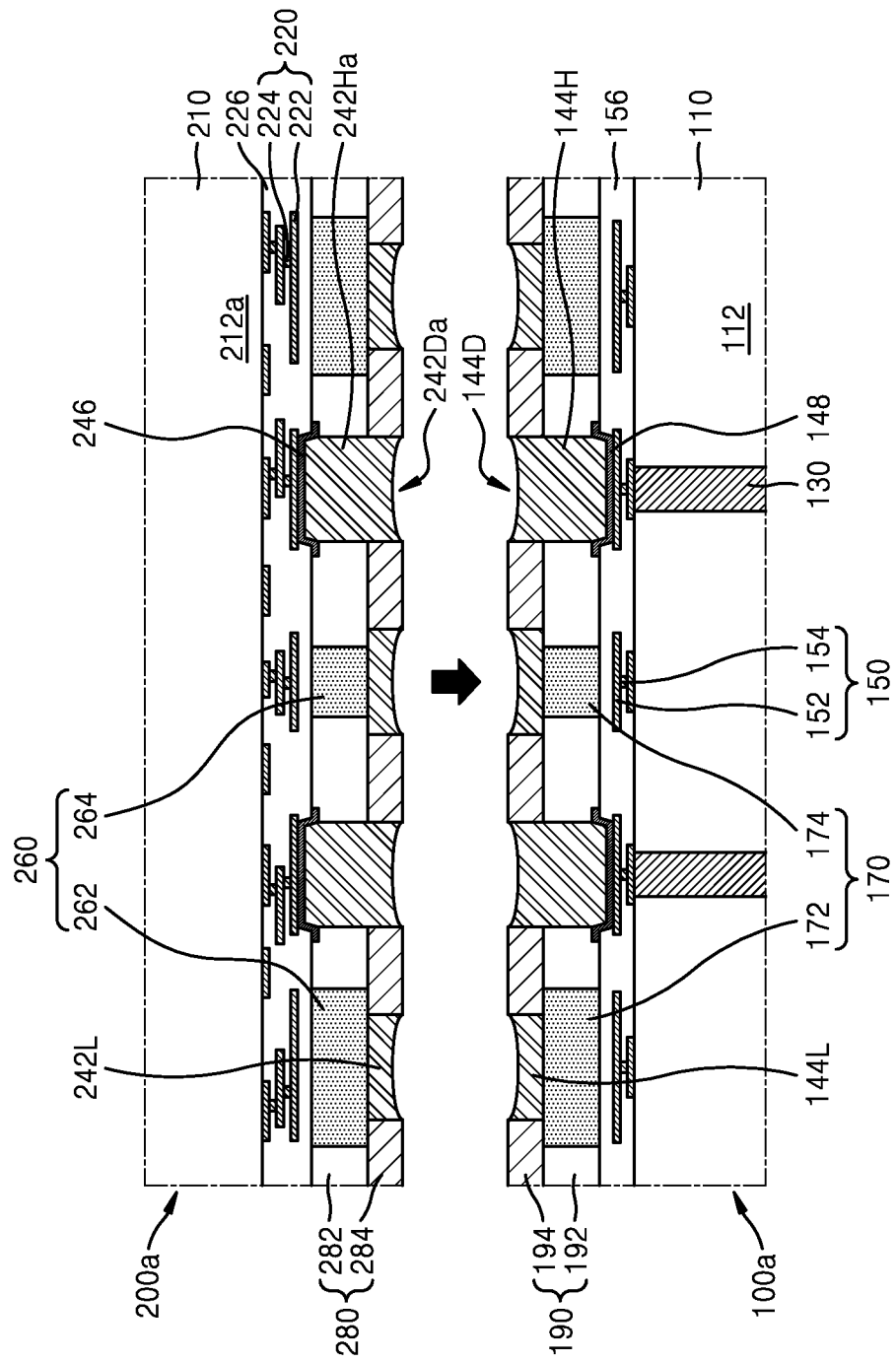
FIG. 10 is a cross-sectional view showing a method of manufacturing a semiconductor package, according to an embodiment.

FIG. 10 is a cross-sectional view showing a method of manufacturing a semiconductor package, according to an embodiment. In detail, FIG. 10 is an enlarged cross-sectional view of a portion corresponding to the region IX of FIG. 8.

Referring to FIG. 10, the second even semiconductor chip 200a is prepared in a similar manner to the description of FIGS. 3A to 3G. The second even semiconductor chip 200a may include the front cover layer 280 including the lower front cover layer 282 covering the second front wiring structure 220, and the upper front cover layer 284 covering the lower front cover layer 282, the front dummy conductive layer 260 penetrating the lower front cover layer 282 and including at least one front wide dummy pattern 262 and a plurality of front narrow dummy patterns 264, and a plurality of even front connection pads 242Ha penetrating the front cover layer 280 and connected to the front UBM layer 246. The first thick rear connection pads 144H may correspond to the lower pad portion BPL of the even bonded pads BPa of FIG. 9, and a plurality of front connection pads 242Ha may correspond to an upper pad portion BPHa of the even bonded pads BPa. Similarly to the first dishing portion 144D, the even front connection pads 242a may have a second even dishing portion 242Da.

Thereafter, the second even semiconductor chip 200a is attached on the first semiconductor chip 100a such that the first upper rear cover layer 194 and the upper front cover layer 284 are in contact with each other, and the first rear connection pads 144 and the even front connection pads 242a correspond to each other. The first rear connection pads 144 and the even front connection pads 242a corresponding to each other are bonded to each other to form the even bonded pads BPa.

Similarly to the bonding of the second even semiconductor chip 200a on the first semiconductor chip 100a, by bonding the second odd semiconductor chip 200b on the first semiconductor chip 100a, the odd bonded pads BPb illustrated in FIG. 8 may be formed.

Figure 11:
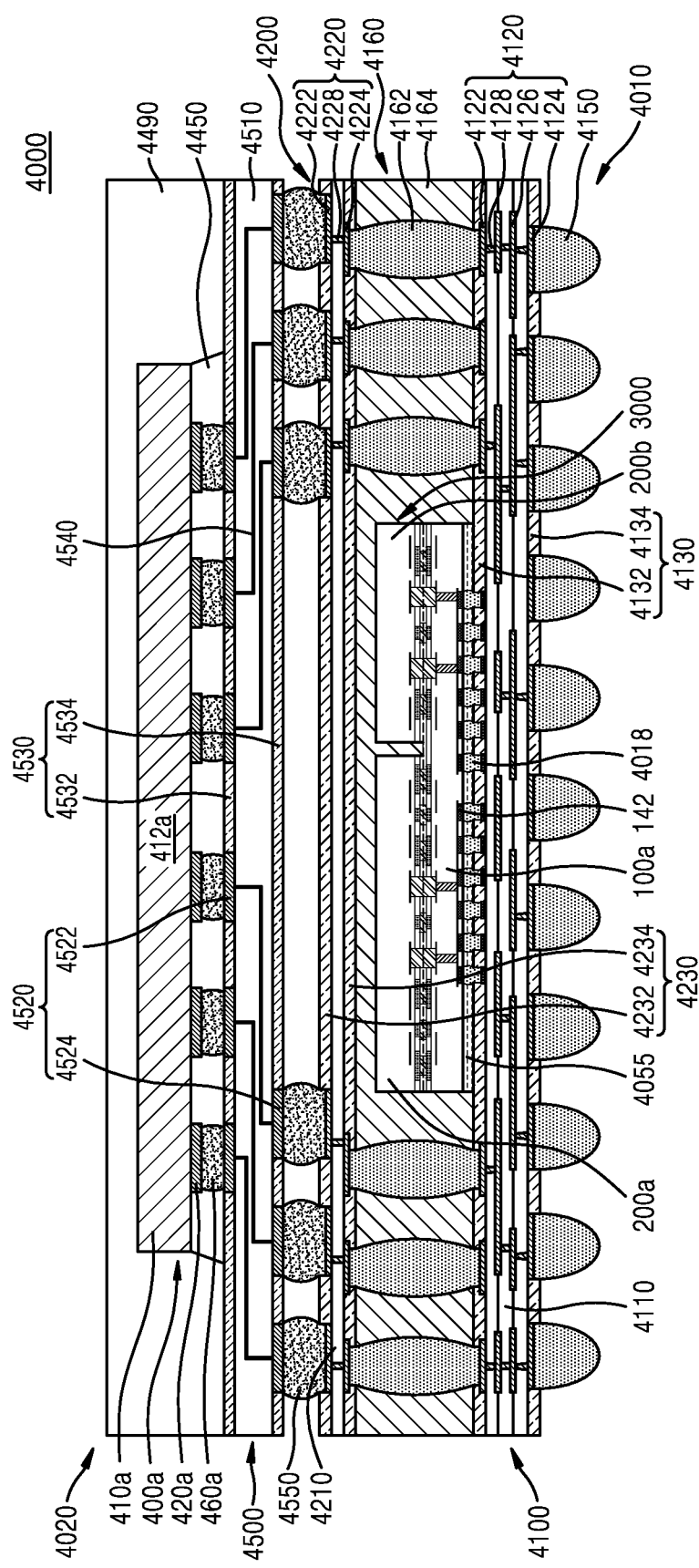
FIGS. 11 and 12 are cross-sectional views of semiconductor packages according to some embodiments.
Figure 12:
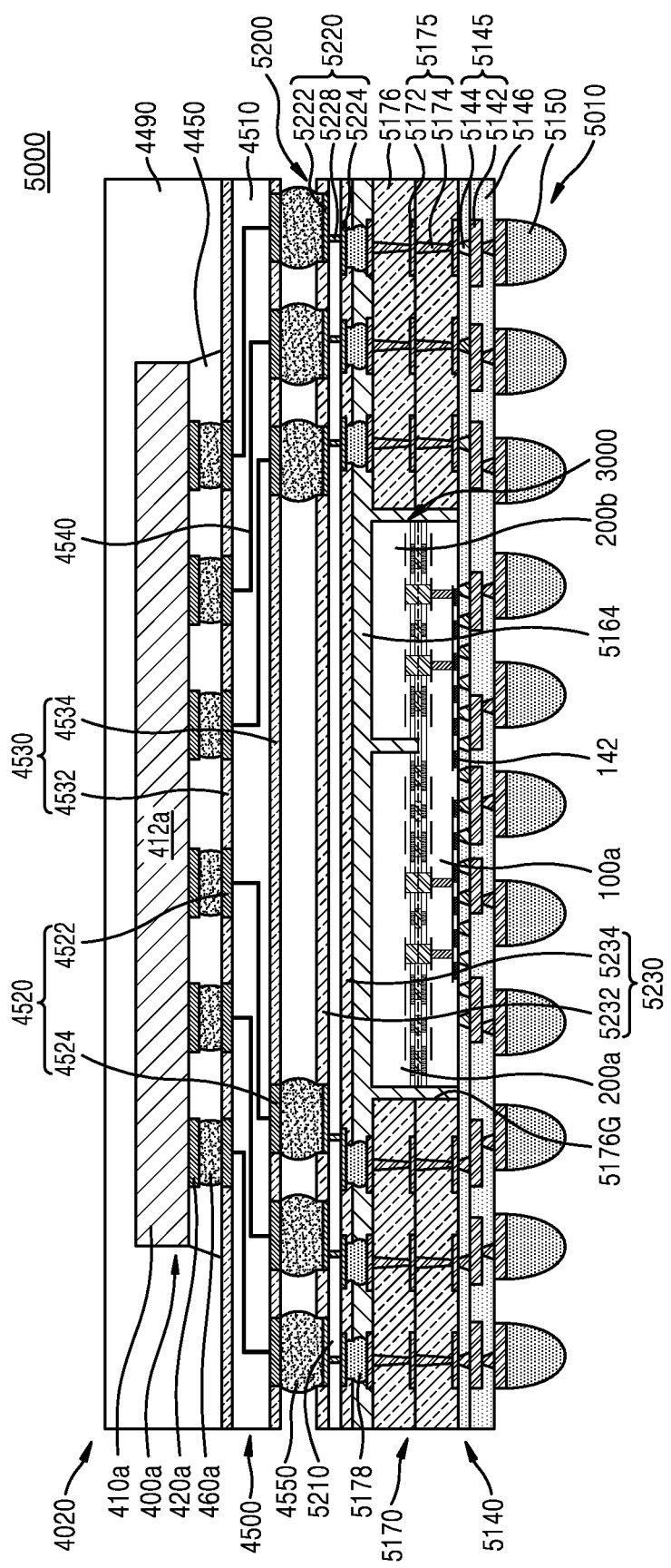

FIGS. 11 and 12 are cross-sectional views of semiconductor packages 4000 and 5000 according to some embodiments.

Referring to FIG. 11, the semiconductor package 4000 may include an upper semiconductor package 4020 stacked on a lower semiconductor package 4010. The semiconductor package 4000 may be a package-on-package (PoP).

The lower semiconductor package 4010 may include a support wiring structure 4100, an expansion layer 4160 disposed on the support wiring structure 4100, the sub-semiconductor package 3000 disposed in the expansion layer 4160, and a cover wiring structure 4200 disposed on the expansion layer 4160. The sub-semiconductor package 3000 may be the semiconductor package 3000 illustrated in FIGS. 8 and 9.

The lower semiconductor package 4010 may be a fan-out semiconductor package in which each of the horizontal width and the planar area of the support wiring structure 4100 and the horizontal width and the planar area of the cover wiring structure 4200 is greater than the horizontal width and the planar area of the sub-semiconductor package 3000. In some embodiments, horizontal widths and the planar areas of the support wiring structure 4100 and the cover wiring structure 4200 may have the same value. In some embodiments, the side surfaces of the support wiring structure 4100, the expansion layer 4160, and the cover wiring structure 4200 corresponding to one another may form a coplanar surface.

The support wiring structure 4100 may be referred to as a lower wiring structure or a first wiring structure, and the cover wiring structure 4200 may be referred to as an upper wiring structure or a second wiring structure.

The support wiring structure 4100 and the cover wiring structure 4200 may be, for example, a printed circuit board, a ceramic substrate, a package manufacturing wafer, or an interposer. In some embodiments, the support wiring structure 4100 and the cover wiring structure 4200 may be a multi-layer printed circuit board. When the support wiring structure 4100 is a printed circuit board, the support wiring structure 4100 may be referred to as a support printed circuit board, a lower printed circuit board, or a first printed circuit board. When the cover wiring structure 4200 is a printed circuit board, the cover wiring structure 4200 may be referred to as a cover printed circuit board, an upper printed circuit board, or a second printed circuit board.

The support wiring structure 4100 may include at least one first base insulating layer 4110 and a plurality of first wiring patterns 4120. The cover wiring structure 4200 may include at least one second base insulating layer 4210 and a plurality of second wiring patterns 4220. The first base insulating layer 4110 and the second base insulating layer 4210 may each include at least one material selected from among phenol resin, epoxy resin, and polyimide.

The first wiring patterns 4120 may include a first upper surface wiring pattern disposed on an upper surface of the at least one first base insulating layer 4110 and including a plurality of first upper surface pads 4122, a first lower surface wiring pattern disposed on a lower surface of the at least one first base insulating layer 4110 and including a plurality of first lower surface pads 4124, and a plurality of first conductive vias 4128 penetrating the at least one first base insulating layer 4110 and electrically connecting the first wiring patterns 4120 disposed on different wiring layers. In some embodiments, when the support wiring structure 4100 has a plurality of first base insulating layers 4110, the first wiring patterns 4120 may further include a first internal wiring pattern 4126 arranged between the two first base insulating layers 4110 adjacent to each other forming a wiring layer.

The second wiring patterns 4220 may include a second upper surface wiring pattern disposed on an upper surface of the at least one second base insulating layer 4210 and including a plurality of second upper surface pads 4222, a second lower surface wiring pattern disposed on a lower surface of the at least one second base insulating layer 4210 and including a plurality of second lower surface pads 4224, and a plurality of second conductive vias 4228 penetrating the at least one second base insulating layer 4210 and electrically connecting the second wiring patterns 4220 disposed on different wiring layers. The first wiring patterns 4120 and the second wiring patterns 4220 may each include copper, nickel, stainless steel, or beryllium copper.

The support wiring structure 4100 may further include a first solder resist layer 4130 disposed on each of the upper surface and the lower surface thereof. The first solder resist layer 4130 may include a first upper surface solder resist layer 4132 covering the upper surface of the at least one first base insulating layer 4110 and exposing the first upper surface pads 4122, and a first lower surface solder resist layer 4134 covering the lower surface of the at least one first base insulating layer 4110 and exposing the first lower surface pads 4124. In some embodiments, while the first lower surface solder resist layer 4134 is formed, the first upper surface solder resist layer 4132 may not be formed.

The cover wiring structure 4200 may further include a second solder resist layer 4230 disposed on the upper surface and the lower surface thereof. The second solder resist layer 4230 may include a second upper surface solder resist layer 4232 covering the upper surface of the at least one second base insulating layer 4210 and exposing the second upper surface pads 4222 of the second upper surface wiring pattern, and a second lower surface solder resist layer 4234 covering the lower surface of the at least one second base insulating layer 4210 and exposing the second lower surface pads 4224 of the second lower surface wiring pattern.

A plurality of first chip connection terminals 4018 are arranged between the first upper surface pads 4122 and the first front pads 142, and may electrically connect the sub-semiconductor package 3000 with the support wiring structure 4100. For example, the first chip connection terminals 4018 may be solder balls or bumps. In some embodiments, an underfill layer 4055 surrounding the first chip connection terminals 4018 may be arranged between the sub-semiconductor package 3000 and the support wiring structure 4100. In some embodiments, the underfill layer 4055 may be a non-conductive film (NCF).

The semiconductor package 4000 may include a plurality of external connection terminals 4150 attached on a plurality of the first lower surface pads 4124. For example, the height of each of the external connection terminals 4150 may be about 150 μm. For example, the external connection terminals 4150 may be solder balls.

The expansion layer 4160 may include a plurality of connection structures 4162, and a filling member 4164 surrounding the plurality of connection structures 4162 and the sub-semiconductor package 3000. The filling member 4164 may fill between the support wiring structure 4100 and the cover wiring structure 4200, and surround the sub-semiconductor package 300. The connection structures 4162 may be apart from the sub-semiconductor package 3000, and disposed around the sub-semiconductor package 3000. The connection structures 4162 may penetrate the filling member 4164 and electrically connect the support wiring structure 4100 and the cover wiring structure 4200. An upper end and a lower end of each of the connection structures 4162 may be in contact with and connected to any one of the second lower surface pads 4224 of the cover wiring structure 4200 and any one of the first upper surface pads 4122 of the support wiring structure 4100.

The upper semiconductor package 4020 may include at least one third semiconductor chip 400a. The upper semiconductor package 4020 may be electrically connected to the lower semiconductor package 4010 through a plurality of package connection terminals 4550 attached on the second upper surface pads 4222 of the lower semiconductor package 4010.

The at least one third semiconductor chip 400a may include a third semiconductor substrate 410a in which a third semiconductor device 412a is formed in an active surface thereof, and a plurality of chip connection pads 420a disposed on the active surface of a third semiconductor substrate 410a. The at least one third semiconductor chip 400a may be a memory semiconductor chip.

Although FIG. 11 illustrates that at least one third semiconductor chip 400a of the upper semiconductor package 4020 is mounted on a package base substrate 4500 by a flip chip method, this is an example, and embodiments of the disclosure are not limited thereto. The semiconductor package 4000 may include, as the upper semiconductor package 4020, all types of semiconductor packages including the at least one third semiconductor chip 400a and the package connection terminals 4550 attached on a lower side thereof to be electrically connected to the lower semiconductor package 4010.

The package base substrate 4500 may include a base board layer 4510 and a plurality of board pads 4520 disposed on an upper surface and a lower surface of the base board layer 4510. The board pads 4520 may include a plurality of board upper surface pads 4522 disposed on the upper surface of the base board layer 4510 and a plurality of board lower surface pads 4524 disposed on the lower surface of the base board layer 4510. In some embodiments, the package base substrate 4500 may be a printed circuit board. A board solder resist layer 4530 for exposing the board pads 4520 may be formed on the upper surface and the lower surface of the base board layer 4510. The board solder resist layer 4530 may include an upper board solder resist layer 4532 covering the upper surface of the base board layer 4510 and exposing the board upper surface pads 4522, and a lower board solder resist layer 4534 covering the lower surface of the base board layer 4510 and exposing the board lower surface pads 4524.

The package base substrate 4500 may include a board wiring 4540 electrically connecting the board upper surface pads 4522 with the board lower surface pads 4524 in the base board layer 4510. The board wiring 4540 may include a board wiring line and a board wiring via.

The board upper surface pads 4522 may be electrically connected to the third semiconductor chip 400*a*. For example, a plurality of second chip connection terminals 460*a* are arranged between the chip connection pads 420*a* of the third semiconductor chip 400*a* and the board upper surface pads 4522 of the package base substrate 4500, thereby electrically connecting the third semiconductor chip 400*a* and the package base substrate 4500. In some embodiments, a second underfill layer 4450 surrounding the second chip connection terminals 460*a* may be arranged between the third semiconductor chip 400*a* and the package base substrate 4500. The second underfill layer 4450 may include, for example, epoxy resin formed by a capillary underfill method.

A molding layer 4490 surrounding the third semiconductor chip 400*a* may be disposed on the package base substrate 4500. The molding layer 4490 may include, for example, an epoxy mold compound (EMC).

Referring to FIG. 12, the semiconductor package 5000 may include the upper semiconductor package 4020 stacked on a lower semiconductor package 5010. As the upper semiconductor package 4020 is substantially the same as the upper semiconductor package 4020 described with reference to FIG. 11, detailed descriptions thereof are omitted.

The lower semiconductor package 5010 may include a support wiring structure 5140, an expansion layer 5170 disposed on the support wiring structure 5140 and having a mounting space 5176G, the sub-semiconductor package 3000 disposed in the mounting space 5176G of the expansion layer 5170, and a cover wiring structure 5200 disposed on the expansion layer 5170. The expansion layer 5170 may surround the vicinity of the sub-semiconductor package 3000. The sub-semiconductor package 3000 may be the semiconductor package 3000 illustrated in FIGS. 8 and 9.

The lower semiconductor package 5010 may be a fan-out semiconductor package. In some embodiments, the expansion layer 5170 may be a panel board, and the lower semiconductor package 5010 may be a fan-out panel level package (FOPLP). For example, the lower semiconductor package 5010 may be a chip first fan-out panel level package (chip first FOPLP) in which the support wiring structure 5140 is formed after the cover wiring structure 5200 is attached on the expansion layer 5170. The support wiring structure 5140 may be referred to as a redistribution layer.

In some embodiments, the horizontal width and the planar area of the mounting space 5176G may be greater than the footprint of the horizontal width and the planar area of the sub-semiconductor package 3000. The side surface of the sub-semiconductor package 3000 may be apart from the inner side surface of the mounting space 5176G.

The support wiring structure 5140 may include a redistribution conductive structure 5145 and a plurality of redistribution insulating layers 5146. The redistribution conductive structure 5145 and the redistribution insulating layers 5146 may be referred to as a first wiring pattern and a first base insulating layer, respectively. The redistribution conductive structure 5145 may include a plurality of redistribution line patterns 5142 disposed on at least one of an upper surface and a lower surface of each of the redistribution insulating layers 5146, and a plurality of redistribution vias 5144 each penetrating at least one of the redistribution insulating layers 5146 and in contact with and connected to a portion of each of the redistribution line patterns 5142. In some embodiments, at least a portion of each of the redistribution line patterns 5142 is formed with a portion of each of the redistribution vias 5144, thereby forming one body. In some embodiments, the redistribution vias 5144 may each have a tapered shape as a horizontal width thereof decreases while extending from the lower side to the upper side. In other words, the redistribution vias 5144 may each have a horizontal width increasing away from a first semiconductor chip 100*a*. The first front pads 142 of the sub-semiconductor package 3000 may be electrically connected to the redistribution conductive structure 5145.

The expansion layer 5170 may be, for example, a printed circuit board, a ceramic substrate, a package manufacturing wafer, or an interposer. In some embodiments, the expansion layer 5170 may be a multi-layer printed circuit board. The mounting space 5176G may be formed in the expansion layer 5170 as an opening portion or cavity. The mounting space 5176G may be formed in a partial area, for example, a central area, of the expansion layer 5170. The mounting space 5176G may be formed by being recessed from an upper surface of the expansion layer 5170 by a certain depth, or opened by extending from the upper surface of the expansion layer 5170 to a lower surface thereof. The expansion layer 5170 may include a plurality of connection structures 5175 and at least one substrate base 5176. The connection structures 5175 may include a connection wiring pattern 5172 and a connection conductive via 5174.

The lower semiconductor package 5010 may further include a filling member 5164 filling a space between the sub-semiconductor package 3000 and the expansion layer 5170, and between the expansion layer 5170 and the cover wiring structure 5200. The filling member 5164 may surround the sub-semiconductor package 3000. The filling member 5164 may include, for example, EMC.

The cover wiring structure 5200 including a plurality of second wiring patterns 5220 that are electrically connected to the connection structures 5175 is disposed on expansion layer 5170. The cover wiring structure 5200 may include at least one second base insulating layer 5210 and the second wiring patterns 5220. The second wiring patterns 5220 may include a second upper surface wiring pattern disposed on the upper surface of the at least one second base insulating layer 5210 and including a plurality of second upper surface pads 5222, a second lower surface wiring pattern disposed on the lower surface of the at least one second base insulating layer 5210 and including a plurality of second lower surface pads 5224, and a plurality of second conductive vias 5228 penetrating the at least one second base insulating layer 5210 and electrically connecting the second wiring patterns 5220 disposed on different wiring layers. In some embodiments, a plurality of internal connection terminals 5178 are arranged between the connection structures 5175 and the second lower surface pads 5224, thereby electrically connecting the connection structures 5175 with the second wiring patterns 5220.

While example embodiments of the disclosure have been particularly shown and described, it will be understood that various changes in form and details may be made therein without departing from the spirit and scope of the following claims.

What is claimed is:

1. A semiconductor package comprising:
   a first semiconductor chip comprising:
      a first semiconductor substrate having a first active surface and a first inactive surface opposite to the first active surface,
      a plurality of through electrodes penetrating at least a portion of the first semiconductor substrate, and
      a rear cover layer comprising a first rear cover layer provided on the first inactive surface and an second rear cover layer provided on the first rear cover layer;
   a second semiconductor chip provided on the first semiconductor chip, the second semiconductor chip comprising:
      a second semiconductor substrate having a second active surface and a second inactive surface that is opposite to the second active surface, and
      a front cover layer comprising a first front cover layer provided on the second active surface, and an second front cover layer provided on the first front cover layer, wherein the second front cover layer faces the second rear cover layer;
   a plurality of signal pad structures penetrating the rear cover layer and the front cover layer and electrically connected to the plurality of through electrodes, wherein a portion of each of the plurality of signal pad structures penetrating the second rear cover layer and the second front cover layer has a first horizontal width; and
   a plurality of dummy pad structures spaced apart from the plurality of signal pad structures in a horizontal direction, and penetrating the rear cover layer and the front cover layer,
   wherein a portion of each of the plurality of dummy pad structures penetrating the second rear cover layer and the second front cover layer has the first horizontal width, and
   wherein a portion of at least one of the plurality of dummy pad structures penetrating the first rear cover layer and the first front cover layer has a horizontal width that is different from the first horizontal width.

2. The semiconductor package of claim 1, wherein a portion of each of the plurality of signal pad structures penetrating the first rear cover layer and the first front cover layer has the first horizontal width, and
   wherein, in each of the plurality of signal pad structures, a portion penetrating the rear cover layer and a portion penetrating the front cover layer are diffusion bonded to each other forming one body.

3. The semiconductor package of claim 1, wherein the portion of the at least one of the plurality of dummy pad structures penetrating the first rear cover layer and the first front cover layer has a second horizontal width that is greater than the first horizontal width, and
   wherein a portion of at least another one of the plurality of dummy pad structures penetrating the first rear cover layer and the first front cover layer has a third horizontal width that is less than the first horizontal width.

4. The semiconductor package of claim 1, wherein the portions of the plurality of signal pad structures penetrating the second rear cover layer and the second front cover layer and the portions of the plurality of dummy pad structures penetrating the second rear cover layer and the second front cover layer are each arranged at a same pitch, and
   wherein, in each of the plurality of dummy pad structures, a portion penetrating the second rear cover layer and a portion penetrating the second front cover layer are diffusion bonded to each other forming one body.

5. The semiconductor package of claim 1, wherein the second rear cover layer and the second front cover layer are bonded to each other forming a covalent bond.

6. The semiconductor package of claim 1, wherein a lower surface of each of the plurality of signal pad structures is lower than a lower surface of each of the plurality of dummy pad structures, and
   wherein an upper surface of each of the plurality of signal pad structures is higher than an upper surface of each of the plurality of dummy pad structures.

7. The semiconductor package of claim 1, wherein each of the plurality of through electrodes overlaps a corresponding one of the plurality of signal pad structures in a vertical direction, and
   wherein the plurality of dummy pad structures do not overlap the plurality of through electrodes in the vertical direction.

8. The semiconductor package of claim 1, wherein a portion of each of the plurality of signal pad structures penetrating the first rear cover layer and the first front cover layer has a fourth horizontal width that is different from the first horizontal width.

9. The semiconductor package of claim 8, wherein, in each of the plurality of signal pad structures, a portion penetrating the second rear cover layer and a portion penetrating the second front cover layer are diffusion bonded to each other forming one body.

10. The semiconductor package of claim 1, wherein each of the plurality of dummy pad structures is surrounded by an insulating material and electrically floated by the insulating material.

11. A semiconductor package comprising:
    a first semiconductor chip comprising:
       a first semiconductor substrate having a first active surface and a first inactive surface that is opposite to the first active surface,
       a first semiconductor device on the first active surface,
       a plurality of front pads on the first active surface,
       a plurality of first through electrodes penetrating at least a portion of the first semiconductor substrate and electrically connected to the plurality of front pads,
       a first rear cover layer provided on the first inactive surface, and
       a rear dummy conductive layer comprising a rear wide dummy pattern and a rear narrow dummy pattern, each of the rear wide dummy pattern and the rear narrow dummy pattern penetrating the first rear cover layer;
    a second semiconductor chip comprising:
       a second semiconductor substrate having a second active surface and a second inactive surface opposite to the second active surface,
       a second semiconductor device on the second active surface,
       a first front cover layer provided on the second active surface, and a front dummy conductive layer comprising a front wide dummy pattern and a front narrow dummy pattern, each of the front wide dummy pattern and the front narrow dummy pattern penetrating the first front cover layer, wherein the second semiconductor chip is bonded on the first semiconductor chip such that the first active surface faces the second inactive surface;

a bonding cover layer between the first semiconductor chip and the second semiconductor chip;

a plurality of bonded pads penetrating the first rear cover layer, the bonding cover layer, and the first front cover layer, the plurality of bonded pads being electrically connected to the plurality of first through electrodes, each of the plurality of bonded pads having a first horizontal width; and a plurality of dummy bonded pads penetrating the bonding cover layer, each of the plurality of dummy bonded pads being provided between the rear wide dummy pattern and the front wide dummy pattern or provided between the rear narrow dummy pattern and the front narrow dummy pattern, each of the plurality of dummy bonded pads having the first horizontal width, wherein a horizontal width of at least one of the rear wide dummy pattern, the rear narrow dummy pattern, the front wide dummy pattern, and the front narrow dummy pattern is different from the first horizontal width.

12. The semiconductor package of claim 11, wherein each of the rear wide dummy pattern and the front wide dummy pattern has a second horizontal width that is greater than the first horizontal width, and wherein each of the rear narrow dummy pattern and the front narrow dummy pattern has a third horizontal width that is less than the first horizontal width.

13. The semiconductor package of claim 11, wherein the plurality of bonded pads and the plurality of dummy bonded pads are each arranged at a same pitch.

14. The semiconductor package of claim 11, wherein the bonding cover layer comprises a second rear cover layer covering the first rear cover layer and a second front cover layer covering the first front cover layer, and wherein the second rear cover layer and the second front cover layer are bonded to each other forming a covalent bond.

15. The semiconductor package of claim 11, wherein each of the plurality of first through electrodes overlaps a corresponding one of the plurality of bonded pads in a vertical direction, and wherein the plurality of dummy bonded pads do not overlap the plurality of first through electrodes in the vertical direction.

16. The semiconductor package of claim 11, further comprising:

a rear wiring structure between the first semiconductor substrate and the first rear cover layer;

a rear inter-wiring insulating layer surrounding the rear wiring structure;

a front wiring structure between the second semiconductor substrate and the first front cover layer; and a front inter-wiring insulating layer surrounding the front wiring structure, wherein a first end of each of the plurality of bonded pads extends into the rear inter-wiring insulating layer and is electrically connected to the rear wiring structure, and wherein a second end of each of the plurality of bonded pads extends into the front inter-wiring insulating layer and is electrically connected to the front wiring structure.

17. The semiconductor package of claim 16, further comprising:

a first rear under bump metallurgy (UBM) layer between the first end of each of the plurality of bonded pads and the rear wiring structure; and a front UBM layer between the second end of each of the plurality of bonded pads and the front wiring structure.

18. The semiconductor package of claim 11, wherein the second semiconductor chip further comprises a plurality of second through electrodes penetrating at least a portion of the second semiconductor substrate and electrically connected to the plurality of bonded pads, and wherein the plurality of first through electrodes, the plurality of bonded pads, and the plurality of second through electrodes are aligned in a vertical direction.

19. A semiconductor package comprising:

a first semiconductor chip;

at least two second semiconductor chips stacked on the first semiconductor chip;

a first bonding cover layer between the first semiconductor chip and a second semiconductor chip at a bottom of the at least two second semiconductor chips;

a second bonding cover layer between the at least two second semiconductor chips;

a plurality of first bonded pads and a plurality of first dummy bonded pads between the second semiconductor chip at the bottom of the at least two second semiconductor chips and the first semiconductor chip; and a plurality of second bonded pads and a plurality of second dummy bonded pads between the at least two second semiconductor chips, wherein the first semiconductor chip comprises:

a first semiconductor substrate having a first active surface and a first inactive surface opposite to the first active surface, a plurality of front pads on the first active surface, a plurality of first through electrodes penetrating at least a portion of the first semiconductor substrate and electrically connecting the plurality of front pads with the plurality of first bonded pads, a first rear cover layer provided on the first inactive surface of the first semiconductor substrate, a first rear wide dummy pattern and a first rear narrow dummy pattern, each of the first rear wide dummy pattern and the first rear narrow dummy pattern being provided in the first rear cover layer, wherein each of the at least two second semiconductor chips comprises:

a second semiconductor substrate having a second active surface and a second inactive surface opposite to the second active surface, a first front cover layer provided on the second active surface, a front wide dummy pattern and a front narrow dummy pattern, each of the front wide dummy pattern and the front narrow dummy pattern being provided in the first front cover layer, a plurality of second through electrodes penetrating at least a portion of the second semiconductor substrate and electrically connecting the plurality of first bonded pads with the plurality of second bonded pads, a second rear cover layer provided on the second inactive surface, and a second rear wide dummy pattern and a second rear narrow dummy pattern, each of the second rear wide dummy pattern and the second rear narrow dummy pattern being provided in the second rear cover layer, wherein the plurality of first bonded pads penetrate the first rear cover layer, the first bonding cover layer, and the first front cover layer of the second semiconductor chip at the bottom, wherein the plurality of second bonded pads penetrate the first front cover layer of one of the at least two second semiconductor chips, the second rear cover layer of another one of the at least two second semiconductor chips, and the second bonding cover layer, wherein the first front cover layer of the one of the at least two second semiconductor chips faces the second rear cover layer of the another one of the at least two second semiconductor chips, wherein the plurality of first dummy bonded pads penetrate the first bonding cover layer, wherein the plurality of second dummy bonded pads penetrate the second bonding cover layer, wherein the plurality of first bonded pads and the plurality of first dummy bonded pads have a same first horizontal width and are arranged at a same pitch, and wherein the plurality of second bonded pads and the plurality of second dummy bonded pads have the same first horizontal width and are arranged at the same pitch.

20. The semiconductor package of claim 19, wherein each of the first rear wide dummy pattern, the front wide dummy pattern, and the second rear wide dummy pattern have a second horizontal width that is greater than the first horizontal width, and wherein each of the first rear narrow dummy pattern, the front narrow dummy pattern, and the second rear narrow dummy pattern have a third horizontal width that is less than the first horizontal width.

* * * * *